United States Patent
Lue et al.

(10) Patent No.: US 12,382,635 B2
(45) Date of Patent: Aug. 5, 2025

(54) 3D FLASH MEMORY DEVICE AND METHOD OF MANUFACTURING THE SAME

(71) Applicant: MACRONIX International Co., Ltd., Hsinchu (TW)

(72) Inventors: Hang-Ting Lue, Hsinchu (TW); Teng Hao Yeh, Hsinchu County (TW); Cheng-Yu Lee, Taoyuan (TW); Wei-Chen Chen, Taoyuan (TW)

(73) Assignee: MACRONIX International Co., Ltd., Hsinchu (TW)

( * ) Notice: Subject to any disclaimer, the term of this patent is extended or adjusted under 35 U.S.C. 154(b) by 567 days.

(21) Appl. No.: 17/845,601

(22) Filed: Jun. 21, 2022

(65) Prior Publication Data

US 2023/0413552 A1    Dec. 21, 2023

(51) Int. Cl.
*H10B 43/27* (2023.01)
*H01L 23/535* (2006.01)
*H10B 43/40* (2023.01)

(52) U.S. Cl.
CPC ........... *H10B 43/27* (2023.02); *H01L 23/535* (2013.01); *H10B 43/40* (2023.02)

(58) Field of Classification Search
CPC ........ H10B 43/20; H10B 43/40; H10B 43/27; H10B 43/50; H10B 41/27; H10B 51/10; H10B 43/10; H10B 51/20; H10B 41/10; H10B 51/30; H10B 43/35; H10B 41/20; H10B 41/50; H01L 23/535; H01L 29/6684; H01L 29/78391; H01L 29/40111; H01L 29/40117; H01L 29/42348; H01L 29/40114; H01L 29/42332; H01L 29/66833; H01L 29/66825; H01L 23/528; B01D 15/1894; H10D 30/6755; H10D 99/00; H10D 30/6757; H10D 64/037; H10D 64/035; H10D 30/6893; H10D 30/697;

(Continued)

(56) References Cited

U.S. PATENT DOCUMENTS 11,600,520 B2 * 3/2023 Wang ................. H01L 23/5329
2015/0340371 A1 11/2015 Lue (Continued)

FOREIGN PATENT DOCUMENTS

TW    202137505    10/2021

OTHER PUBLICATIONS

"Office Action of Taiwan Counterpart Application", issued on Mar. 16, 2023, p. 1-p. 7.

*Primary Examiner* — Mouloucoulaye Inoussa
(74) *Attorney, Agent, or Firm* — J.C. PATENTS

(57) ABSTRACT

A three-dimensional flash memory device may be a AND flash memory device. The three-dimensional flash memory device includes: a substrate, a gate stack structure, a plurality of slit structures, a plurality of memory arrays, and a plurality of conductive pillars. The gate stack structure is located above the substrate. The plurality of slit structures extend through the gate stack structure and divide the gate stack structure into a plurality of blocks. The plurality of memory arrays are disposed in the gate stack structure of the plurality of blocks. The plurality of conductive pillars extends through the gate stack structure in the plurality of blocks, and disposed between the plurality of memory arrays and between the plurality of slit structures.

18 Claims, 20 Drawing Sheets

(58) Field of Classification Search
CPC ............ H10D 30/0411; H10D 30/0413; G11C 11/2275; G11C 11/221; G11C 11/223; G11C 16/0416; G11C 16/0483; G11C 11/5628; G11C 16/0475; G11C 5/063; G11C 16/0441

See application file for complete search history.

(56) References Cited

U.S. PATENT DOCUMENTS

| | | | |
|---|---|---|---|
| 2016/0233224 A1 | 8/2016 | Rhie | |
| 2016/0260490 A1 | 9/2016 | Lee et al. | |
| 2018/0019257 A1* | 1/2018 | Son | H10B 43/30 |
| 2019/0067311 A1* | 2/2019 | Yoshimizu | H01L 29/66825 |
| 2020/0013791 A1* | 1/2020 | Or-Bach | H10B 41/27 |
| 2020/0083248 A1* | 3/2020 | Uchida | H10B 43/27 |
| 2020/0098773 A1* | 3/2020 | Kaneko | H10B 43/27 |
| 2020/0176033 A1* | 6/2020 | Hosotani | G11C 16/0483 |
| 2020/0381450 A1* | 12/2020 | Lue | H01L 29/792 |
| 2020/0411542 A1* | 12/2020 | Yang | H10D 64/017 |
| 2021/0074711 A1 | 3/2021 | Suzuki et al. | |
| 2021/0091108 A1* | 3/2021 | Naruke | G11C 16/24 |
| 2021/0375919 A1* | 12/2021 | Wang | H01L 23/5226 |
| 2021/0375936 A1* | 12/2021 | Chiang | H10B 51/20 |
| 2021/0375938 A1* | 12/2021 | Lin | H10B 51/30 |
| 2021/0391355 A1* | 12/2021 | Lill | H10B 41/27 |
| 2021/0399003 A1 | 12/2021 | Shin et al. | |
| 2021/0399016 A1* | 12/2021 | Jiang | H10B 41/27 |
| 2021/0407845 A1* | 12/2021 | Wang | H10B 51/10 |
| 2021/0408047 A1* | 12/2021 | Wang | H10B 51/30 |
| 2022/0013536 A1* | 1/2022 | Geng | H10B 43/27 |
| 2022/0036931 A1* | 2/2022 | Lin | H10B 99/00 |
| 2022/0037362 A1* | 2/2022 | Lin | H10B 51/20 |
| 2022/0068957 A1* | 3/2022 | Yeh | H01L 23/5226 |
| 2022/0123012 A1* | 4/2022 | Gao | H01L 23/5226 |
| 2022/0130862 A1* | 4/2022 | Lue | H10B 51/20 |
| 2022/0199639 A1* | 6/2022 | Yeh | H10B 41/41 |
| 2022/0216142 A1* | 7/2022 | Lin | H01L 23/5226 |
| 2022/0216236 A1* | 7/2022 | Lin | H01L 23/5226 |
| 2022/0238551 A1* | 7/2022 | Petti | G11C 11/223 |
| 2022/0262744 A1* | 8/2022 | Masaki | H10B 43/27 |
| 2022/0262809 A1* | 8/2022 | Lin | G11C 8/14 |
| 2022/0278130 A1* | 9/2022 | Yang | H01L 23/5226 |
| 2022/0320017 A1* | 10/2022 | Lin | H01L 23/564 |
| 2022/0328524 A1* | 10/2022 | Huang | H01L 23/5226 |
| 2022/0344222 A1* | 10/2022 | Lin | G11C 29/12 |
| 2022/0352208 A1* | 11/2022 | Yeong | H10B 51/20 |
| 2022/0359571 A1* | 11/2022 | Lu | H10D 64/033 |
| 2022/0384459 A1* | 12/2022 | Lu | H10D 30/6755 |
| 2022/0384470 A1* | 12/2022 | Jiang | H10B 41/10 |
| 2022/0392919 A1* | 12/2022 | Wang | H10B 51/10 |
| 2022/0406709 A1* | 12/2022 | Yang | H10B 43/50 |
| 2022/0415967 A1* | 12/2022 | Barraud | H10N 70/253 |
| 2023/0067455 A1* | 3/2023 | Wang | H01L 21/764 |

* cited by examiner

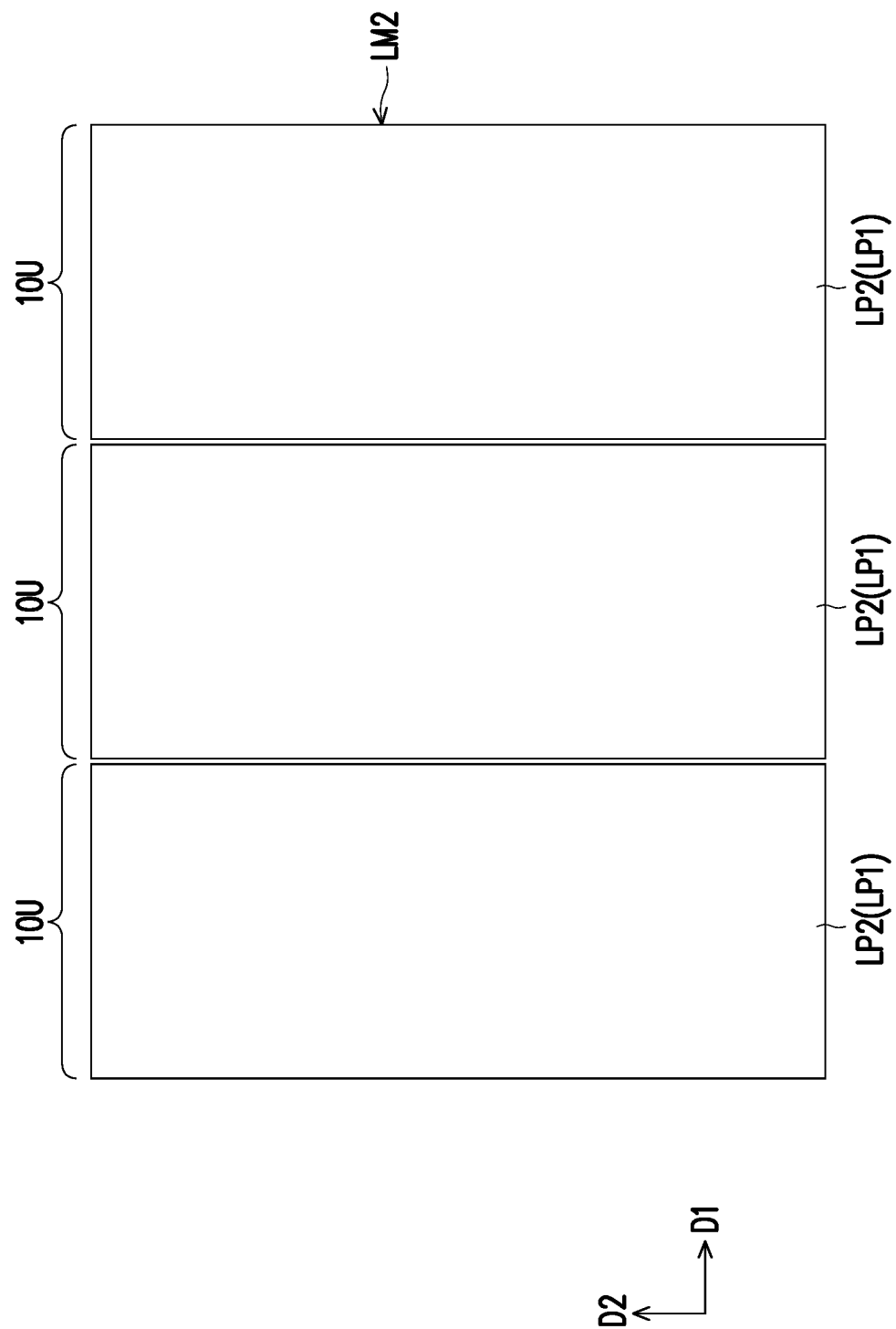

3D FLASH MEMORY DEVICE AND METHOD OF MANUFACTURING THE SAME

BACKGROUND

Technical Field

The embodiment of the disclosure relates to a semiconductor device and a method of manufacturing the same, and particularly to a flash memory device and a method of manufacturing the same.

Description of Related Art

Since a non-volatile memory has the advantage that stored data does not disappear at power-off, it becomes a widely used memory for a personal computer or other electronics equipment. Currently, the 3D memory commonly used in the industry includes a NOR memory and a NAND memory. In addition, another 3D memory is an AND memory, which may be applied to a multi-dimensional memory array with high integration and high area utilization, and has an advantage of a fast operation speed. Therefore, the development of a 3D flash memory device has gradually become the current trend.

SUMMARY

The embodiment of disclosure provides a 3D flash memory device which may form a heater among a plurality of memory arrays.

An embodiment of the present invention provides a method for manufacturing a 3D flash memory device which may be integrated with an existing process to form a heater among a plurality of memory arrays.

A 3D flash memory device according to an embodiment of the disclosure includes a substrate, a gate stack structure, a plurality of slit structures, a plurality of memory arrays, and a plurality of conductive pillars. The gate stack structure is located above the substrate. The plurality of slit structures extend through the gate stack structure and divide the gate stack structure into a plurality of blocks. The plurality of memory arrays are disposed in the gate stack structure of the plurality of blocks. The plurality of conductive pillars extends through the gate stack structure in the plurality of blocks, and disposed between the plurality of memory arrays and between the plurality of slit structures.

A method of manufacturing a 3D flash memory device according to an embodiment of the disclosure includes the following steps. A substrate is provided. A gate stack structure is formed. A plurality of memory arrays in the gate stack structure are formed. A plurality of slit structures are formed, wherein the plurality of slit structures extend through the gate stack structure and divide the gate stack structure into a plurality of blocks. A plurality of conductive pillars are formed in the plurality of blocks, wherein the plurality of conductive pillars are disposed between the plurality of memory arrays and extend through the gate stack structure.

A 3D flash memory chip according to an embodiment of the disclosure includes a plurality of first tiles and a second tile. The first tiles include a plurality of first memory cells. The second tile includes a plurality of second memory cells and a plurality of heater, wherein the second memory cells are sandwiched between the heaters.

The 3D flash memory device of the present disclosure embodiment has heaters between which sandwich a plurality of memory arrays therebetween.

The method of manufacturing the 3D flash memory device of the present disclosure embodiment may be integrated with the existing process to form a heater between a plurality of memory arrays.

The 3D flash memory may be a 3D AND-type flash memory, a 3D NAND-type flash memory or a 3D NOR-type flash memory.

BRIEF DESCRIPTION OF THE DRAWINGS

FIG. 1F to FIG. 1K are cross-sectional views illustrating a 3D AND flash memory having a heater according to some embodiments of the present invention.

FIG. 2A to FIG. 2G are cross-sectional views of a manufacturing process of a 3D AND flash memory device according to an embodiment of the present disclosure.

DESCRIPTION OF THE EMBODIMENTS

Figure 1A:
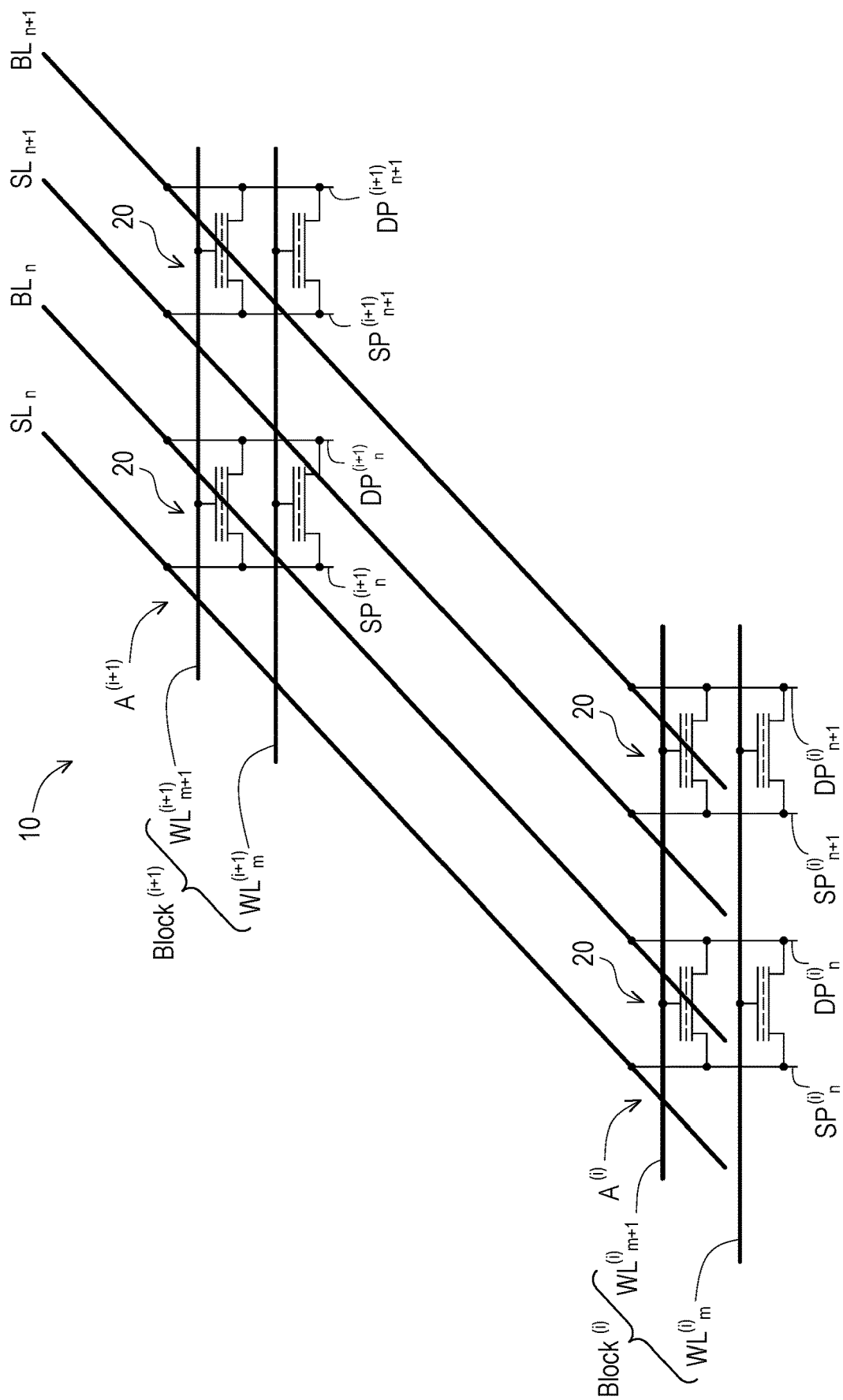
FIG. 1A shows a circuit diagram of a 3D AND flash memory array according to some embodiments in according to the present disclosure.
Figure 1B:
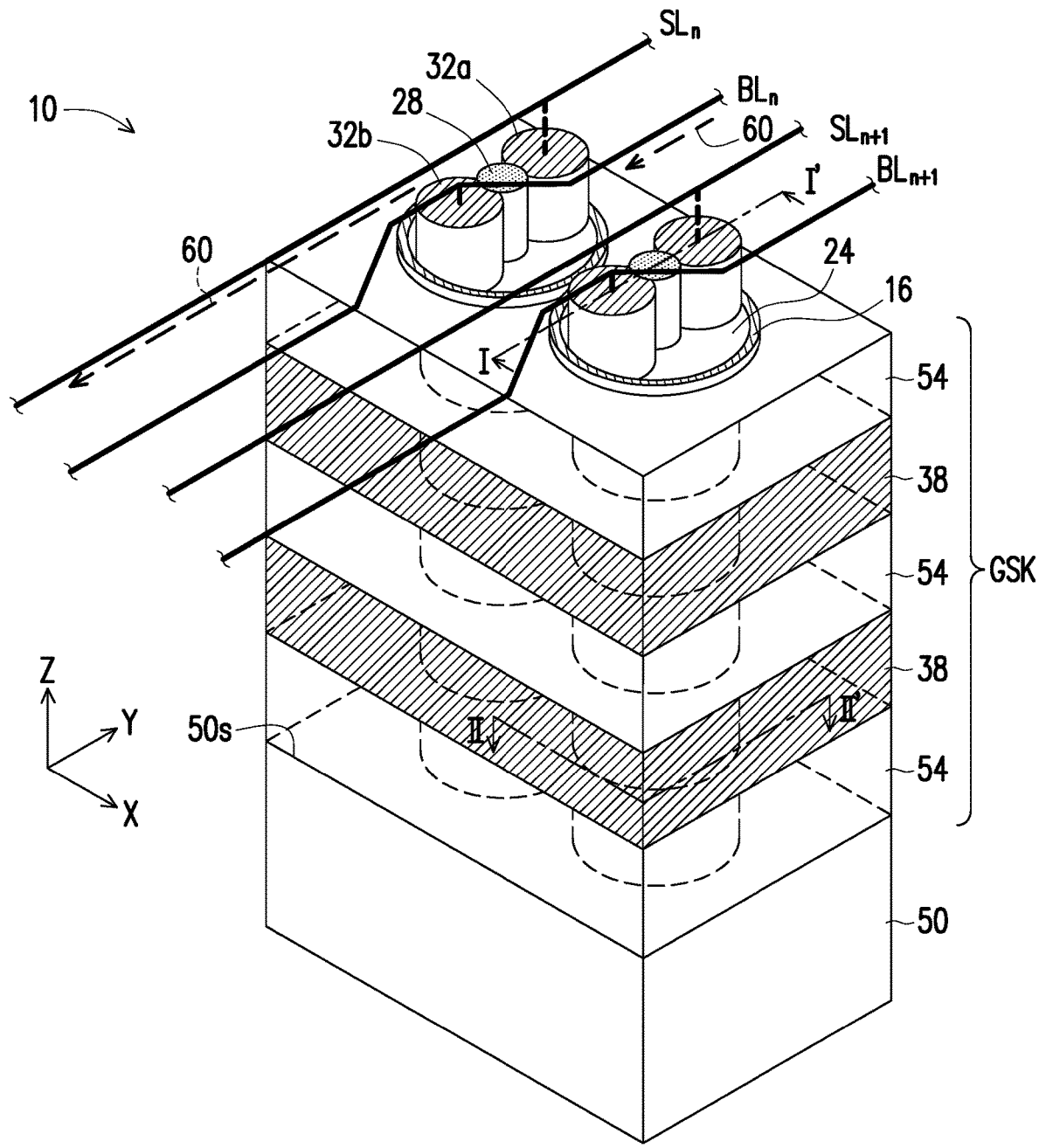
FIG. 1B shows a partial 3D view of the memory array in FIG. 1A.
Figure 1C:
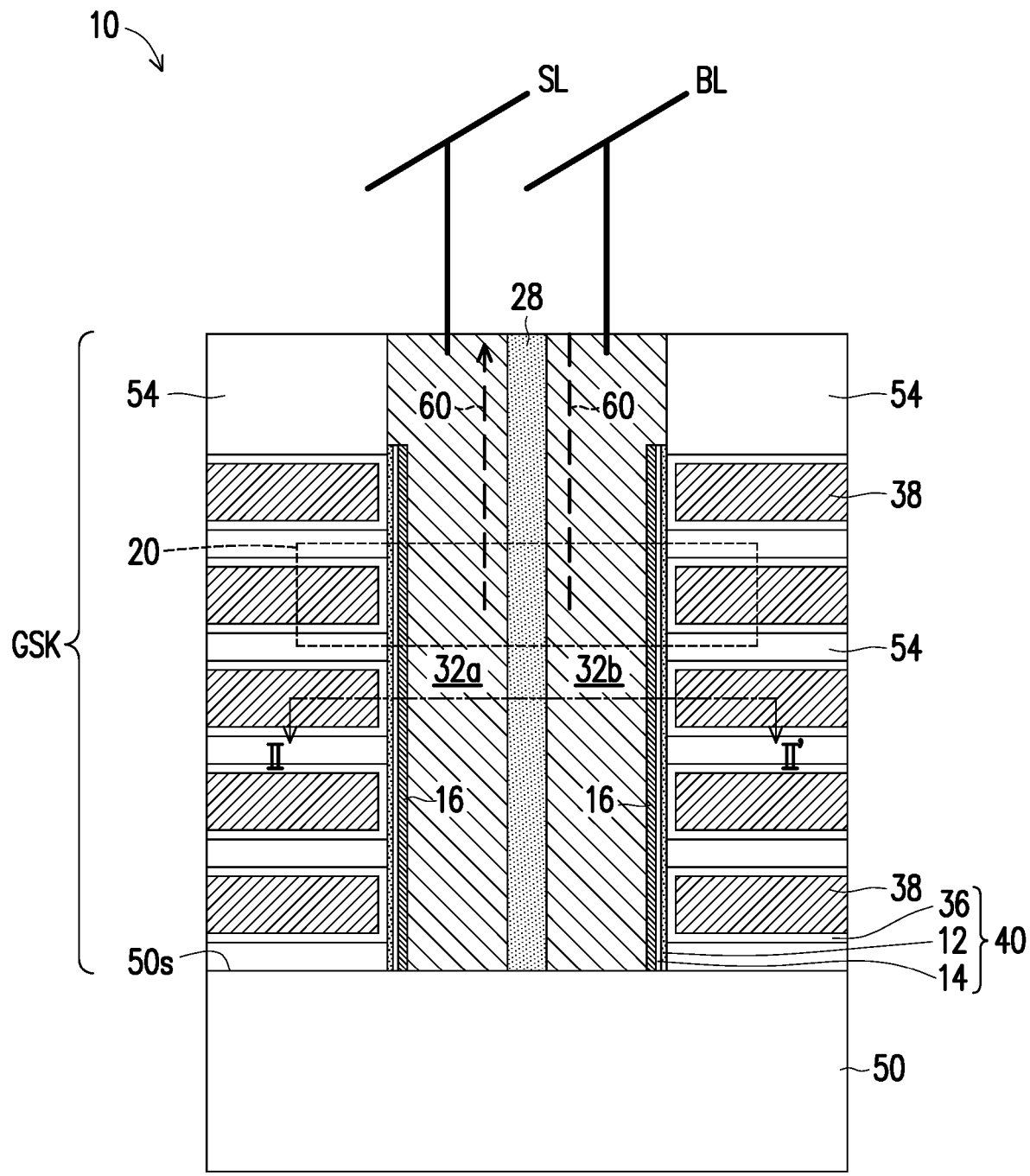
FIG. 1C and FIG. 1D show cross-sectional views taken along line I-I' of FIG. 1B.
Figure 1D:
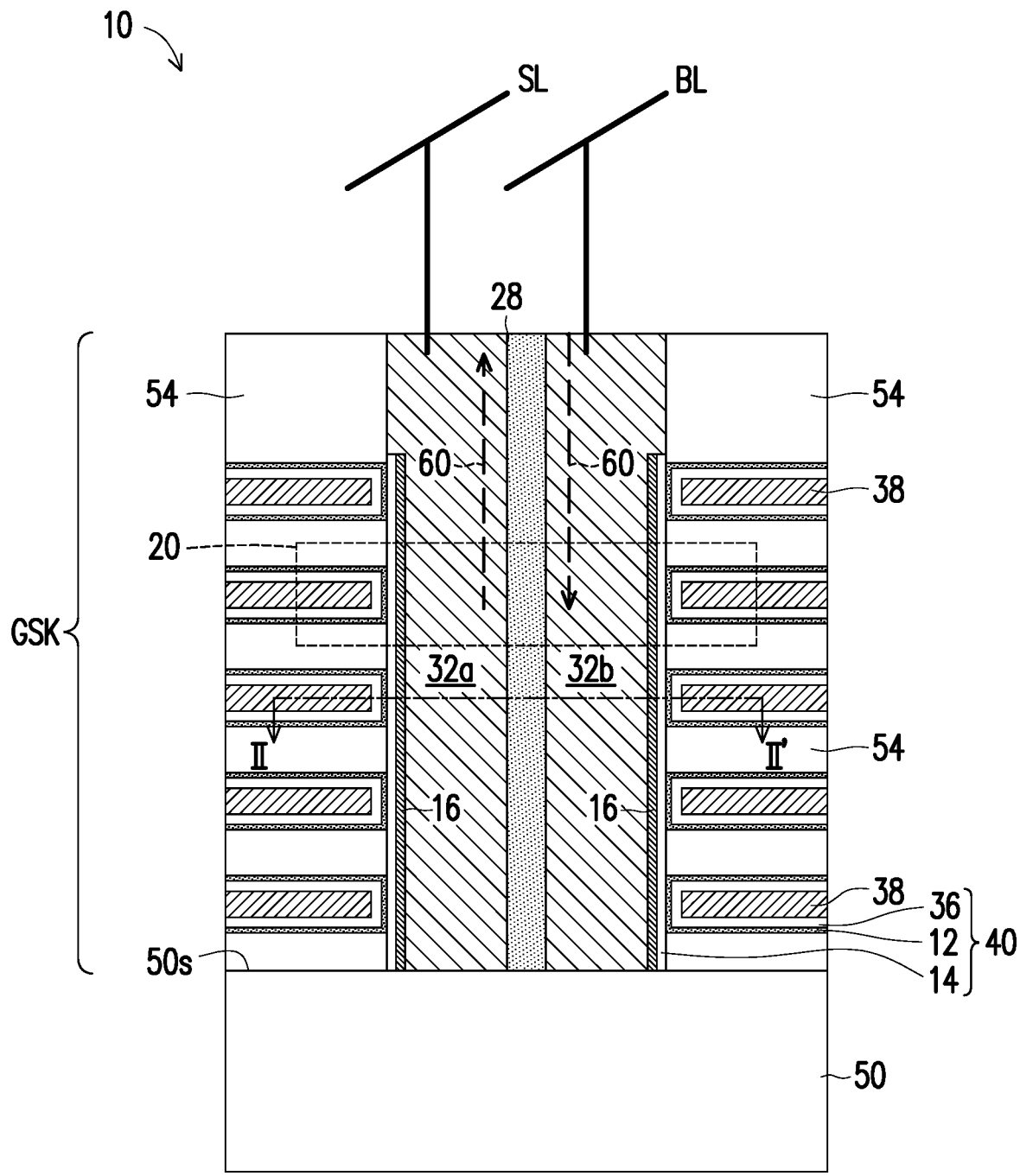
Figure 1E:
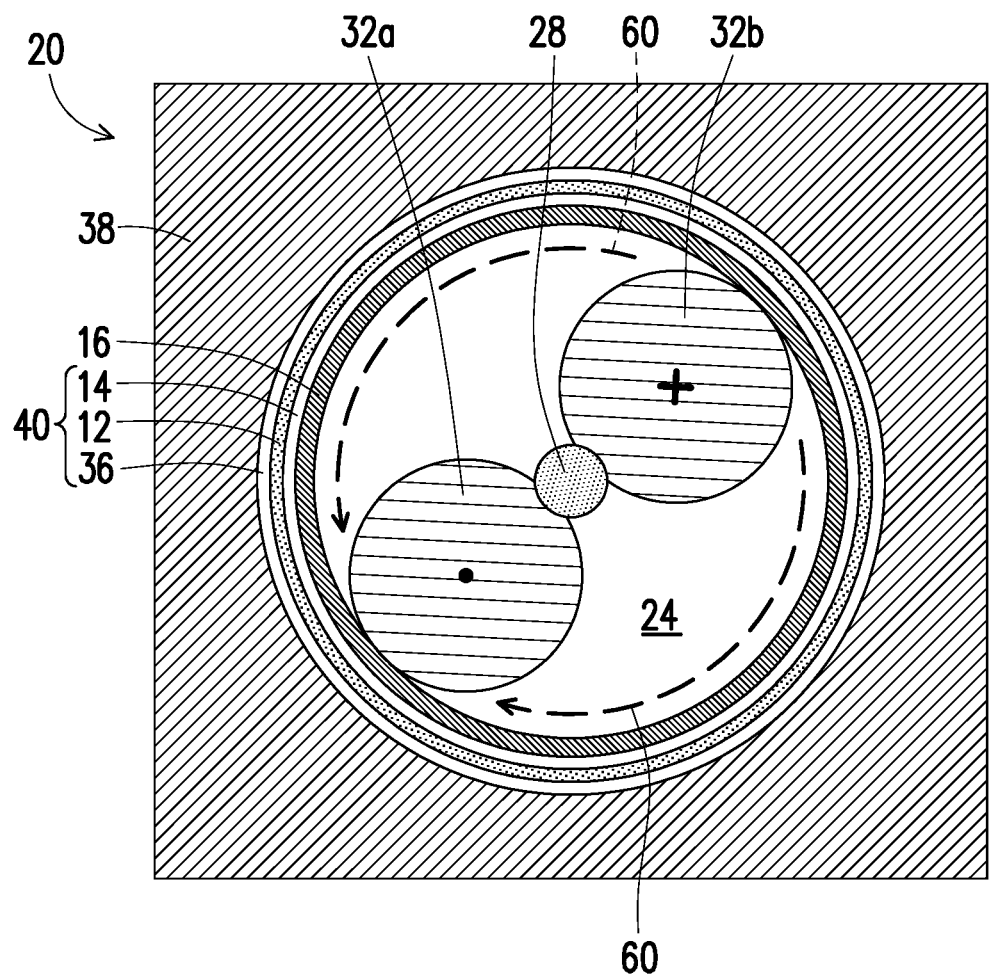
FIG. 1E shows a top view of line II-II' of FIG. 1B, FIG. 1C and FIG. 1D.

FIG. 1A shows a circuit diagram of a 3D AND flash memory array according to some embodiments in according to the present disclosure. FIG. 1B shows a partial three dimensional view of the memory array in FIG. 1A. FIG. 1C and FIG. 1D show cross-sectional views taken along line I-I' of FIG. 1B. FIG. 1E shows a top view of line II-II' of FIG. 1B, FIG. 1C and FIG. 1D.

FIG. 1A shows a schematic view of two blocks BLOCK$^{(i)}$ and BLOCK$^{(i+1)}$ of a vertical AND memory array 10 arranged in rows and columns. The block BLOCK$^{(i)}$ includes a memory array A$^{(i)}$. A row (e.g., an (m+1)$^{th}$ row) of the memory array A$^{(i)}$ is a set of AND memory cells 20 having a common word line (e.g., WL$^{(i)}_{m+1}$). The AND memory cells 20 of the memory array A$^{(i)}$ in each row (e.g., the (m+1)$^{th}$ row) correspond to a common word line (e.g., WL$^{(i)}_{m+1}$) and are coupled to different source pillars (e.g., SP$^{(i)}_{n}$ and SP$^{(i)}_{n+1}$) and drain pillars (e.g., DP$^{(i)}_{n}$ and DP$^{(i)}_{n+1}$), so that the AND memory cells 20 are logically arranged in a row along the common word line (e.g., WL$^{(i)}_{m+1}$).

A column (e.g., an n$^{th}$ column) of the memory array A$^{(i)}$ is a set of AND memory cells 20 having a common source pillar (e.g., SP$^{(i)}_{n}$) and a common drain pillar (e.g., DP$^{(i)}_{n}$). The AND memory cells 20 of the memory array A$^{(i)}$ in each column (e.g., the n$^{th}$ column) correspond to different word lines (e.g., WL$^{(i)}_{m+1}$ and WL$^{(i)}_{m}$) and are coupled to a common source pillar (e.g., SP$^{(i)}_{n}$) and a common drain pillar (e.g., DP$^{(i)}_{n}$). Hence, the AND memory cells 20 of the memory array A$^{(i)}$ are logically arranged in a column along the common source pillar (e.g., SP$^{(i)}_{n}$) and the common drain pillar (e.g., DP$^{(i)}_{n}$). In the physical layout, according to the manufacturing method as applied, the columns or rows may be twisted and arranged in a honeycomb pattern or other patterns for high density or other reasons.

In FIG. 1A, in the block BLOCK$^{(i)}$, the AND memory cells 20 in the n$^{th}$ column of the memory array A$^{(i)}$ share a common source pillar (e.g., SP$^{(i)}_n$) and a common drain pillar (e.g., DP$^{(i)}_n$). The AND memory cells 20 in an (n+1)$^{th}$ column share a common source pillar (e.g., SP$^{(i)}_{n+1}$) and a common drain pillar (e.g., DP$^{(i)}_{n+1}$).

The common source pillar (e.g., SP$^{(i)}_n$) is coupled to a common source line (e.g., SL$_n$) and the common drain pillar (e.g., DP$^{(i)}_n$) is coupled to a common bit line (e.g., BL$_n$). The common source pillar (e.g., SP$^{(i)}_{n+1}$) is coupled to a common source line (e.g., SL$_{n+1}$) and the common drain pillar (e.g., DP$^{(i)}_{n+1}$) is coupled to a common bit line (e.g., BL$_{n+1}$).

Likewise, the block BLOCK$^{(i+1)}$ includes a memory array A$^{(i+1)}$ which is similar to the memory array A$^{(i)}$ in the block BLOCK$^{(i)}$. A row (e.g., an (m+1)$^{th}$ row) of the memory array A$^{(i+1)}$ is a set of AND memory cells 20 having a common word line (e.g., WL$^{(i+1)}_{m+1}$). The AND memory cells 20 of the memory array A$^{(i+1)}$ in each row (e.g., the (m+1)$^{th}$ row) correspond to a common word line (e.g., WL$^{(i+1)}_{m+1}$) and are coupled to different source pillars (e.g., SP$^{(i+1)}_n$ and SP$^{(i+1)}_{n+1}$) and drain pillars (e.g., DP$^{(i+1)}_n$ and DP$^{(i+1)}_{n+1}$). A column (e.g., an n$^{th}$ column) of the memory array A$^{(i+1)}$ is a set of AND memory cells 20 having a common source pillar (e.g., SP$^{(i+1)}_n$) and a common drain pillar (e.g., DP$^{(i+1)}_n$). The AND memory cells 20 are integrated and connected in parallel, and thus may be also referred to as a memory string. The AND memory cells 20 of the memory array A$^{(i+1)}$ in each column (e.g., the n$^{th}$ column) correspond to different word lines (e.g., WL$^{(i+1)}_{m+1}$ and WL$^{(i+1)}_m$) and are coupled to a common source pillar (e.g., SP$^{(i+1)}_n$) and a common drain pillar (e.g., DP$^{(i+1)}_n$). Hence, the AND memory cells 20 of the memory array A$^{(i+1)}$ are logically arranged in a column along the common source pillar (e.g., SP$^{(i+1)}_n$) and the common drain pillar (e.g., DP$^{(i+1)}_n$).

The block BLOCK$^{(i+1)}$ and the block BLOCK$^{(i)}$ share source lines (e.g., SL$_n$ and SL$_{n+1}$) and bit lines (e.g., BL$_n$ and BL$_{n+1}$). Therefore, the source line SL$_n$ and the bit line BL$_n$ are coupled to the n$^{th}$ column of AND memory cells 20 in the AND memory array A$^{(i)}$ of the block BLOCK$^{(i)}$, and are coupled to the n$^{th}$ column of AND memory cells 20 in the AND memory array A$^{(i+1)}$ of the block BLOCK$^{(i+1)}$. Similarly, the source line SL$_{n+1}$ and the bit line BL$_{n+1}$ are coupled to the (n+1)$^{th}$ column of AND memory cells 20 in the AND memory array A$^{(i)}$ of the block BLOCK$^{(i)}$, and are coupled to the (n+1)$^{th}$ column of AND memory cells 20 in the AND memory array A$^{(i+1)}$ of the block BLOCK$^{(i+1)}$.

Referring to FIG. 1B to FIG. 1D, the memory array 10 may be disposed over an interconnect structure of a semiconductor die, for example, being disposed on one or more active devices (e.g., transistors) formed on a semiconductor substrate. Therefore, the dielectric substrate 50 is, for example, a dielectric layer (e.g., a silicon oxide layer) over a conductive interconnect structure formed on a silicon substrate. The memory array 10 may include a gate stack structure GSK, a plurality of channel pillars 16, a plurality of first conductive pillars (also referred to as source pillars) 32a, a plurality of second conductive pillars (also referred to as drain pillars) 32b, and a plurality of charge storage structures 40.

Referring to FIG. 1B, the gate stack structure GSK is formed on the dielectric substrate 50 in the memory array region. The gate stack structure GSK includes a plurality of gate layers (also referred to as word lines) 38 and a plurality of insulating layer 54 vertically stacked on a surface 50s of the dielectric substrate 50. In a direction Z, the gate layers 38 are electrically isolated from each other by the insulating layer 54 disposed therebetween. The gate layers 38 extend in a direction parallel to the surface 50s of the dielectric substrate 50. The gate layers 38 may have a staircase structure (not shown). Therefore, a lower gate layer 38 is longer than an upper gate layer 38, and the end of the lower gate layer 38 extends laterally beyond the end of the upper gate layer 38. A contact (not shown) for connecting the gate layer 38 may land on the end of the gate layer 38 to connect the gate layers 38 respectively to conductive lines.

Referring to FIG. 1B to FIG. 1D, the memory array 10 further includes a plurality of channel pillars 16 stacked along the direction Z. In some embodiments, each of the channel pillars 16 has an annular shape from a top view. A material of the channel pillars includes a semiconductor material, such as undoped polysilicon.

Referring to FIG. 1B to FIG. 1D, the memory array 10 further includes an insulating pillar 28, a plurality of first conductive pillars 32a, and a plurality of second conductive pillars 32b. In this example, the first conductive pillars 32a serve as source pillars. The second conductive pillars 32b serve as drain pillars. The first conductive pillar 32a, the second conductive pillar 32b and the insulating pillar 28 are each extend in a direction (i.e., the direction Z) perpendicular to the surface of the gate layer 38. The first conductive pillar 32a and the second conductive pillar 32b are separated from each other by the insulating pillar 28. The first conductive pillar 32a and the second conductive pillar 32b include doped polysilicon or metal materials. The insulating pillar 28 is, for example, silicon nitride.

Referring to FIG. 1C and FIG. 1D, the charge storage structures 40 are disposed between the channel pillars 16 and the gate layers 38. Each of the charge storage structure 40 may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14 and the blocking layer 36 include silicon oxide. The charge storage layer 12 includes silicon nitride or other materials capable of trapping charges. In some embodiments, as shown in FIG. 1C, a portion (the tunneling layer 14 and the charge storage layer 12) of the charge storage structure 40 continuously extends in a direction (i.e., the direction Z) perpendicular to the gate layer 38, and the other portion (the blocking layer 36) of the charge storage structure 40 surrounds the gate layer 38. In other embodiments, as shown in FIG. 1D, the charge storage layer 12 and the blocking layer 36 of the charge storage structure 40 surround the gate layer 38.

Referring to FIG. 1E, the charge storage structure 40, the channel pillar 16, the source pillar 32a, and the drain pillar 32b are surrounded by the gate layer 38, and a memory cell 20 is defined. According to different operation methods, a 1-bit operation or a 2-bit operation may be performed on the memory cell 20. For example, when a voltage is applied to the source pillar 32a and the drain pillar 32b, since the source pillar 32a and the drain pillar 32b are connected to the channel pillar 16, electrons may be transferred along the channel pillar 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32a and the drain pillar 32b. For an operation involving source side injection, channel-hot-electron injection, or band-to-band tunneling hot carrier injection, electrons or holes may be locally trapped in the charge storage structure 40 adjacent to one of the source pillar 32a and the drain pillar 32b. Accordingly, a single level cell (SLC, 1 bit) or multi-level cell (MLC, greater than or equal to 2 bits) operation may be performed on the memory cell 20.

Referring to FIG. 1A and FIG. 1B, during operation, a voltage is applied to a selected word line (gate layer) 38; for example, when a voltage higher than a corresponding threshold voltage ($V_{th}$) of the corresponding memory cell 20 is applied, the channel pillar 16 intersecting the selected word line 38 is turned on to allow a current to enter the drain pillar 32b from the bit line $BL_n$ or $BL_{n+1}$ (shown in FIG. 1B), flow to the source pillar 32a via the turned-on channel region (e.g., in a direction indicated by arrow 60), and finally flow to the source line $SL_n$ or $SL_{n+1}$ (shown in FIG. 1B).

FIG. 1F to FIG. 1K are cross-sectional views illustrating a 3D AND flash memory having a heater 100 according to some embodiments of the present invention. For clarity, some elements are omitted in FIG. 1F to FIG. 1K.

Figure 1F:
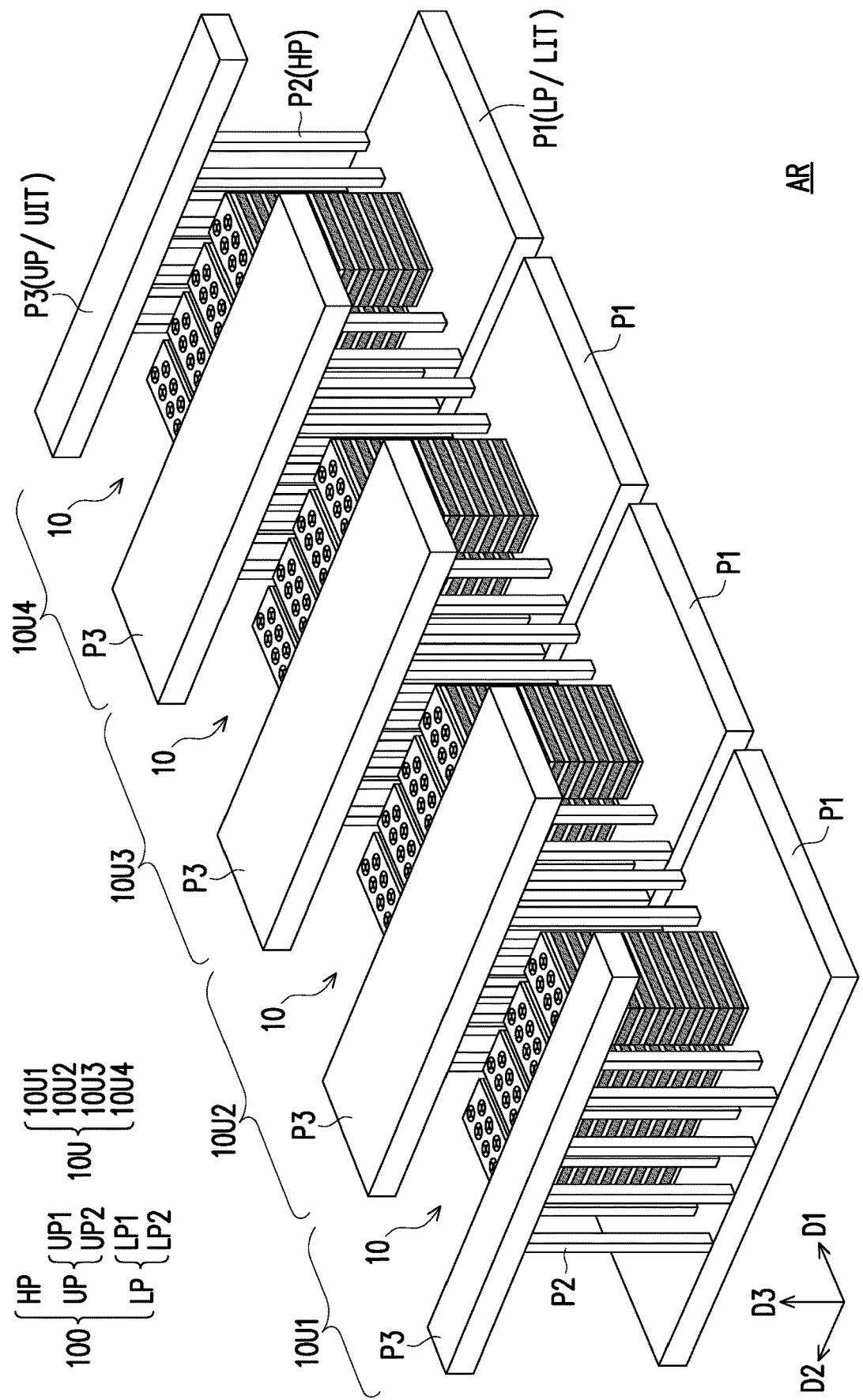

Referring to FIG. 1F, the 3D AND flash memory according to some embodiments of the present invention further includes a heater 100. The heater 100 is a micro-heater, which is located in the memory array region AR. The heater 100 surrounds a plurality of memory arrays 10 in the memory array region AR to heat a plurality of memory cells of the plurality of memory arrays 10 nearby. The damaged memory cell may be repaired through heating and annealing by the heater 100.

Referring to FIG. 1I, the heater 100 passes through the gate stack structure GSK having the plurality of memory arrays 10, and further extends above and below the gate stack structure GSK. The heater 100 may simultaneously heat a single block B or a plurality of block B, such as 4 blocks, 8 blocks (as shown in FIG. 1K), 16 blocks or 32 blocks, but the present invention is not limited thereto.

Figure 1G:
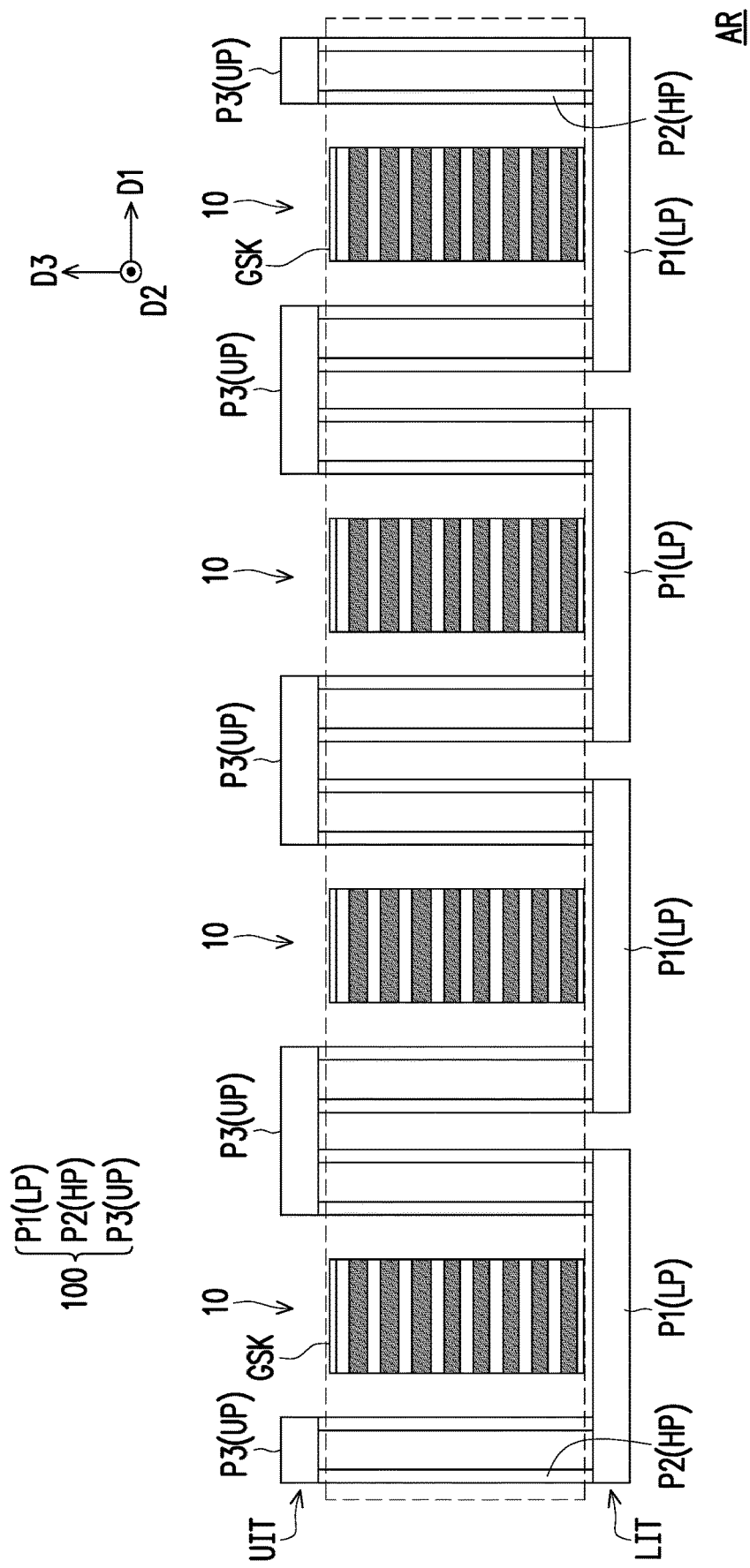

Referring to FIG. 1F and FIG. 1G, the heater 100 is, for example, in the shape of a snake. More specifically, the heater 100 includes a plurality of first portions P1, a plurality of second portions P2, and a plurality of third portions P3 connected to each other. The second portion P2 is located between the first portion P1 and the third portion P3. The first portion P1 and the third portion P3 are partially overlapped, and the overlapping portions are connected by the plurality of second portions P2. The first portion P1 includes a lower hot plate LP. The second portion P2 includes a conductive pillar (or referred to as a heating pillar) HP. The third portion P3 includes an upper hot plate UP.

Referring to FIG. 1F and FIG. 1G, a plurality of conductive pillars HP are arranged around the memory array 10. The plurality of memory arrays 10 are sandwiched between the plurality of conductive pillars HP. In some embodiments, the plurality of conductive pillars HP and the plurality of memory arrays 10 are alternately arranged in a first direction D1.

Figure 1H:
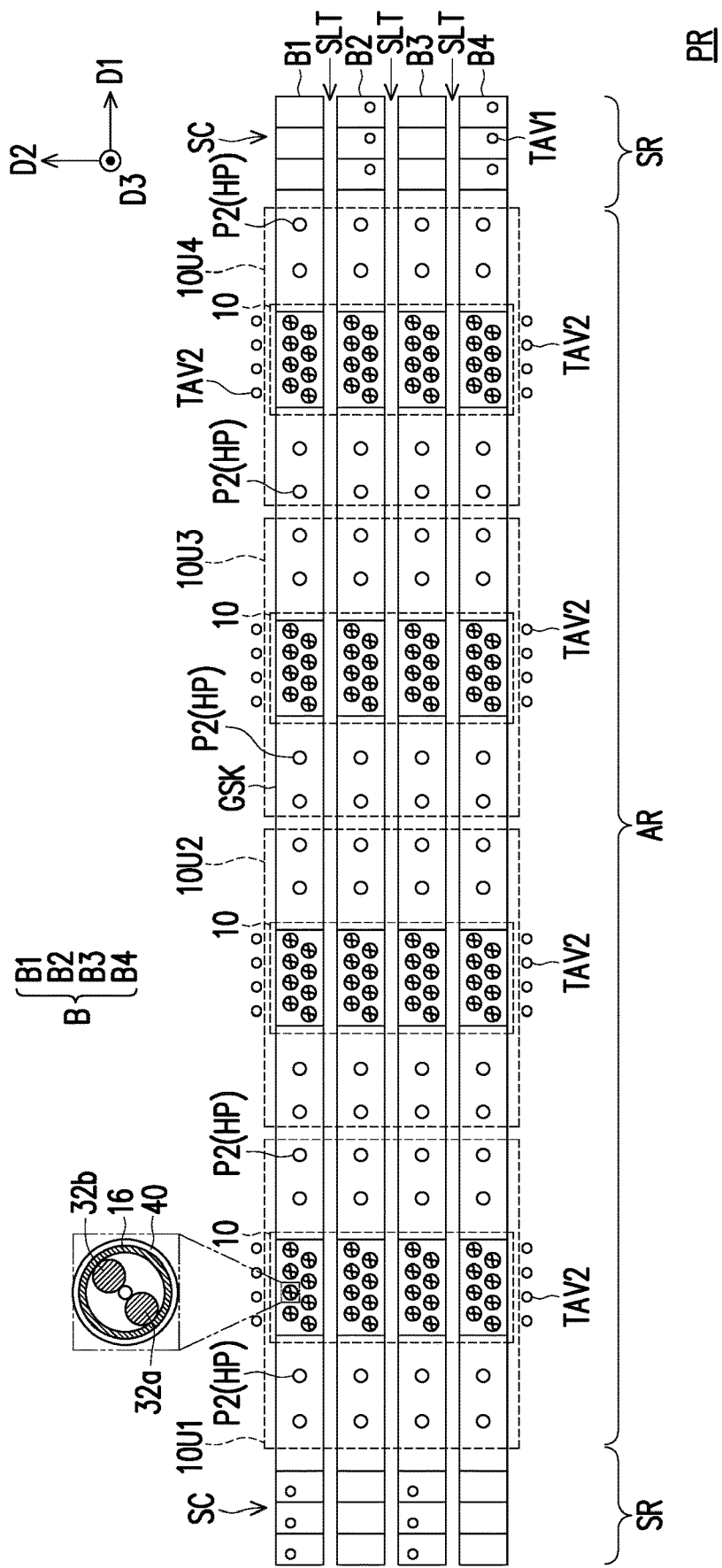
Figure 11:
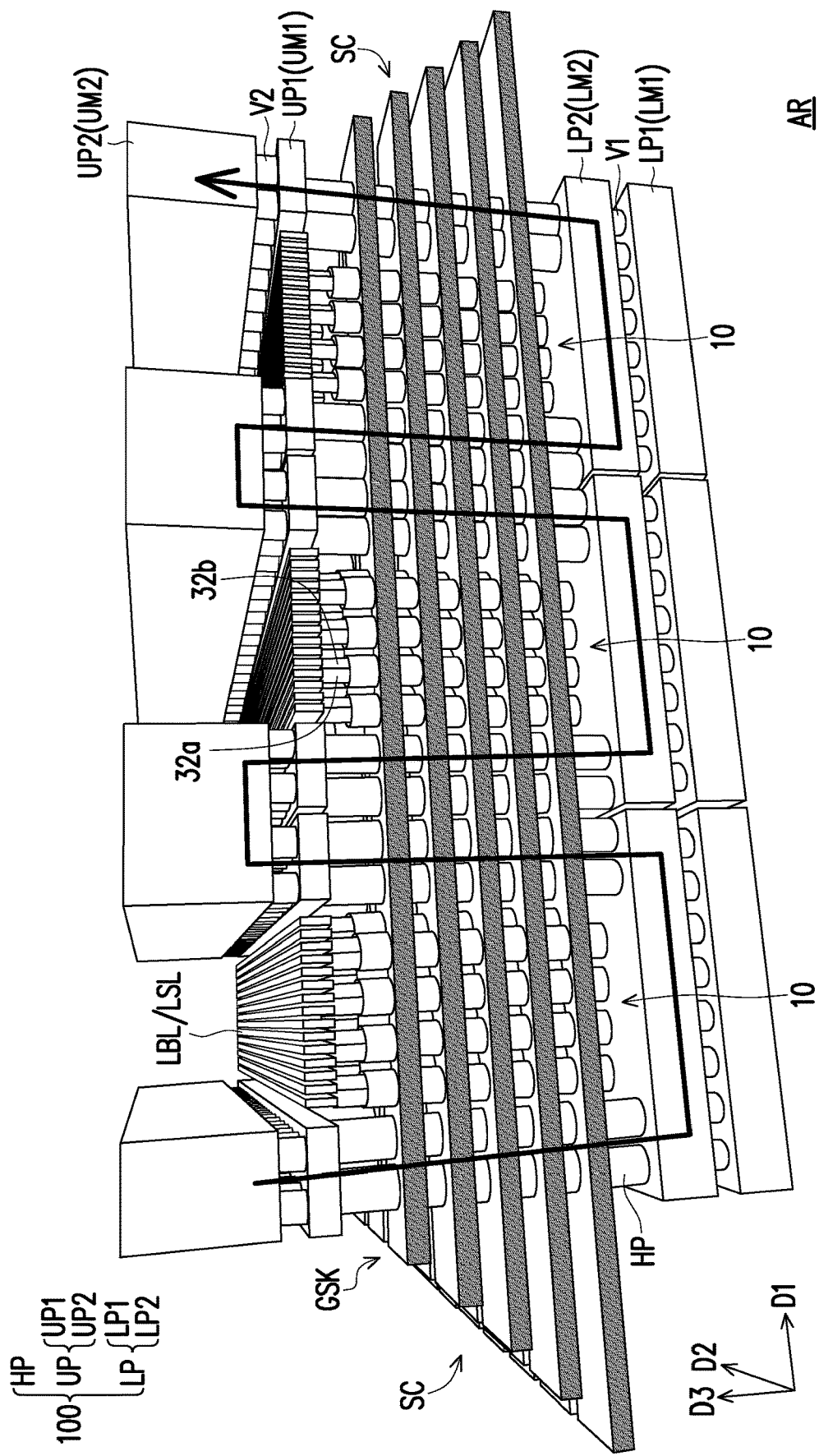
Figure 1J:
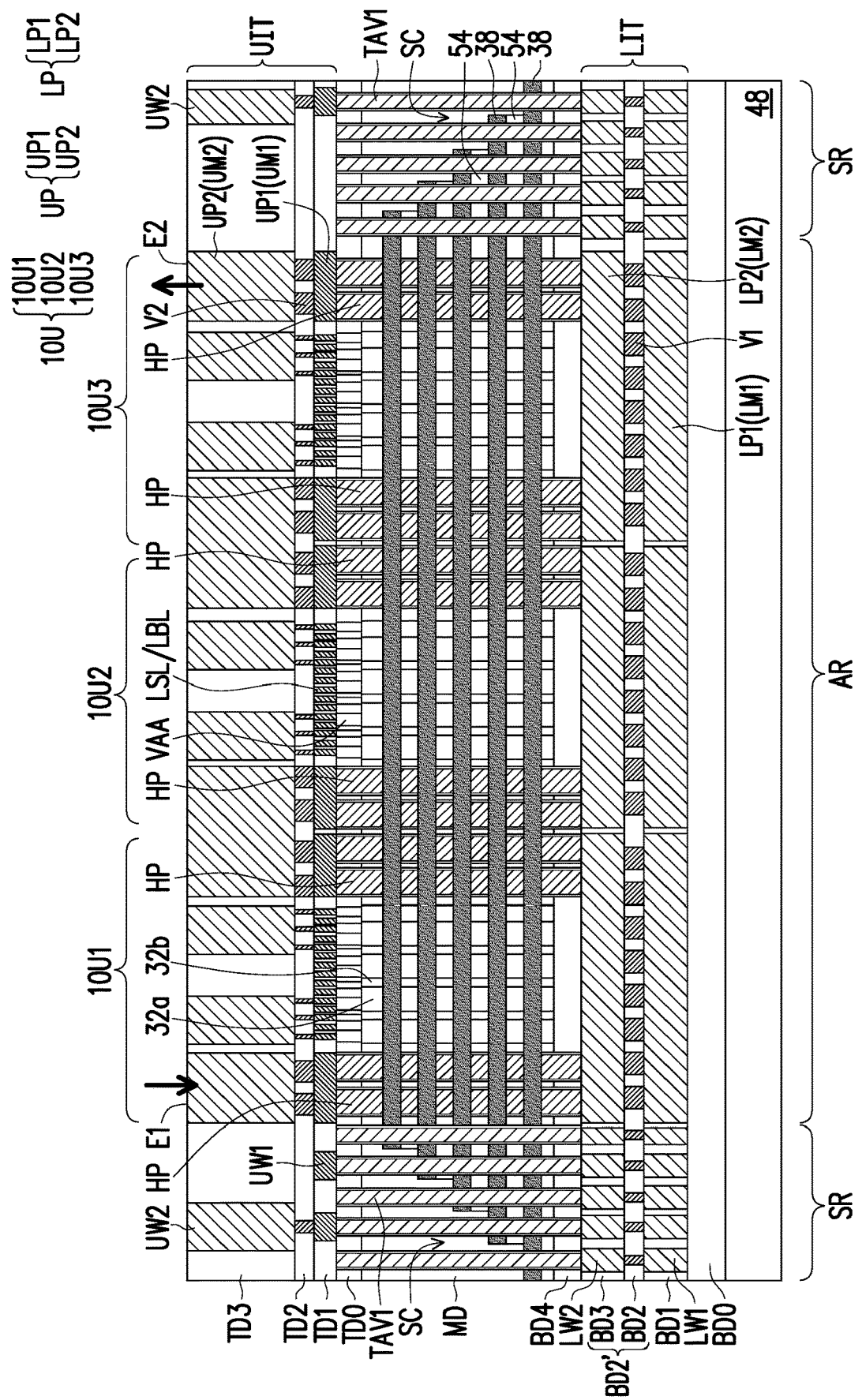
Figure 1K:
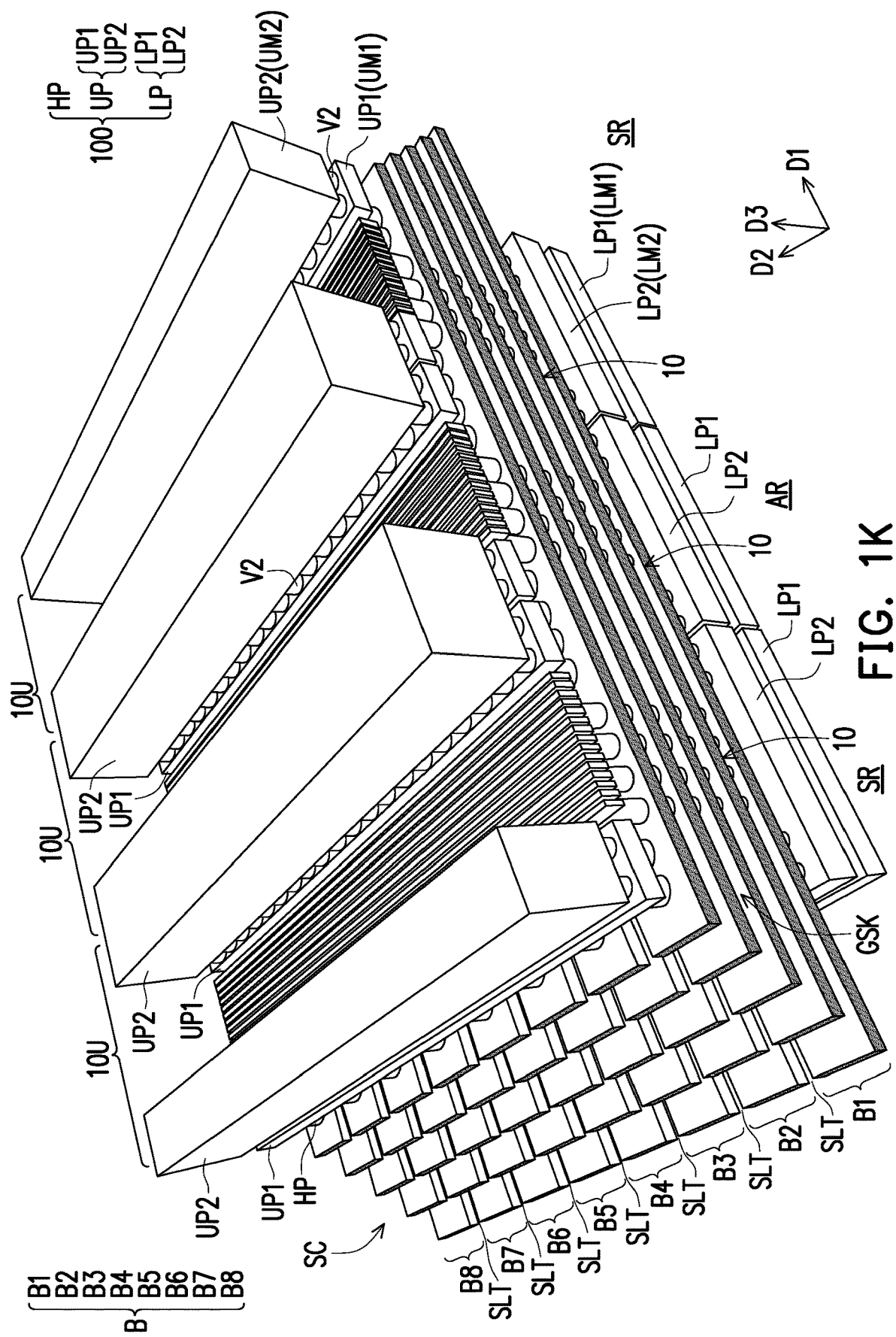

Referring to FIG. 1H and FIG. 1K, the plurality of conductive pillars HP are separated by a plurality of slit structures SLT and laterally adjacent to the plurality of slit structures SLT. The slit structures SLT extend in the first direction D1, and divide the gate stack structure GSK into a plurality of blocks B (for example, B1, B2, B3, and B4). The plurality of conductive pillars HP of the heater 100 are located in the plurality of block B (for example, B1, B2, B3, B4) and extend through the gate stack structure GSK. In some embodiments, the plurality of conductive pillars HP and the plurality of slit structures SLT are alternately arranged in the second direction D2. The second direction D2 is different from the first direction D1. The second direction D2 and the first direction D1 are, for example, perpendicular to each other. The first direction D1 is, for example, the X direction, and the second direction D2 is, for example, the Y direction.

Referring to FIG. 1F and FIG. 1H, in some embodiments, each memory array 10, two rows of conductive pillars HP on both sides thereof, and a lower interconnect structure LIT and an upper interconnect structure UIT thereover and therebelow may be also referred to as a module unit 10U. Therefore, in FIG. 1H, there are four module units 10U1, 10U2, 10U3 and 10U4 between the staircase structures SC. However, the present invention is not limited thereto. In each module unit 10U, more or less rows of conductive pillars HP may be disposed on both sides of each memory array 10. In addition, the number of the plurality of conductive pillars HP on both sides of each module unit 10U may be the same or different. The plurality of conductive pillars HP on both sides of each module unit 10U may be arranged in an array or in a non-array.

Referring to FIG. 1I and FIG. 1J, the plurality of conductive pillars HP are arranged in the memory array region AR between the staircase structures SC. The conductive pillars HP are laterally adjacent to the plurality of source pillars 32a and the plurality of drain pillars 32b. The plurality of conductive pillars HP sandwich the plurality of source pillars 32a and the plurality of drain pillars 32b therebetween.

Referring to FIG. 1H and FIG. 1J, the plurality of conductive pillars HP may be formed simultaneously with other processes. For example, in some embodiments, the 3D AND flash memory further includes a plurality of array vias TAV1 and TAV2. The plurality of array vias TAV1 are disposed in the staircase region SR and pass through the staircase structure SC of the gate stack structure GSK. The plurality of array vias TAV2 are disposed in the peripheral region PR, and pass through insulating materials or dielectric materials in the peripheral region PR. The plurality of conductive pillars HP may be or may be not formed simultaneously with the plurality of array vias TAV1 and TAV2.

Referring to FIG. 1G, the lower hot plate LP of the heater 100 is disposed below the conductive pillar HP and the gate stack structure GSK. The lower hot plate LP may be a portion of the lower interconnect structure LIT disposed below the gate stack structure GSK. The upper hot plate UP of the heater 100 is disposed above the conductive pillar HP and the gate stack structure GSK. The upper hot plate UP may be a portion of the upper interconnect structure UIT disposed above the gate stack structure GSK.

Referring to FIG. 1F and FIG. 1G, in some embodiments, the lower hot plate LP may be a portion of a single conductive layer of the lower interconnect structure LIT. The upper hot plate UP may be a portion of a single conductive layer of the upper interconnect structure UIT. In alternative embodiments, the lower hot plate LP includes a portion of two or more conductive layers of the lower interconnect structure LIT and a plurality of vias (not shown) located between the conductive layers. The upper hot plate UP includes a portion of two or more conductive layers of the upper interconnect structure UIT and a plurality of vias (not shown) located between these conductive layers.

Referring to FIG. 1I and FIG. 1J, particularly, the lower hot plate LP includes a portion of the first lower conductive layer LM1, a portion of the second lower conductive layer LM2 and a plurality of first vias V1 of the lower interconnect structure LIT. The upper hot plate UP includes a portion of the first upper conductive layer UM1, a portion of the second upper conductive layer UM2 and a plurality of second vias V2 of the lower interconnect structure LIT.

Referring to FIG. 1J, the first lower conductive layer LM1 is located between the substrate 48 and the gate stack structure GSK. The second lower conductive layer LM2 is located between the first lower conductive layer LM1 and the gate stack structure GSK. There may be no conductive layer between the first lower conductive layer LM1 and the substrate 48. However, the present invention is not limited thereto. Other conductive layers (not shown) may also be disposed between the first lower conductive layer LM1 and the substrate 48.

Figure 2A:
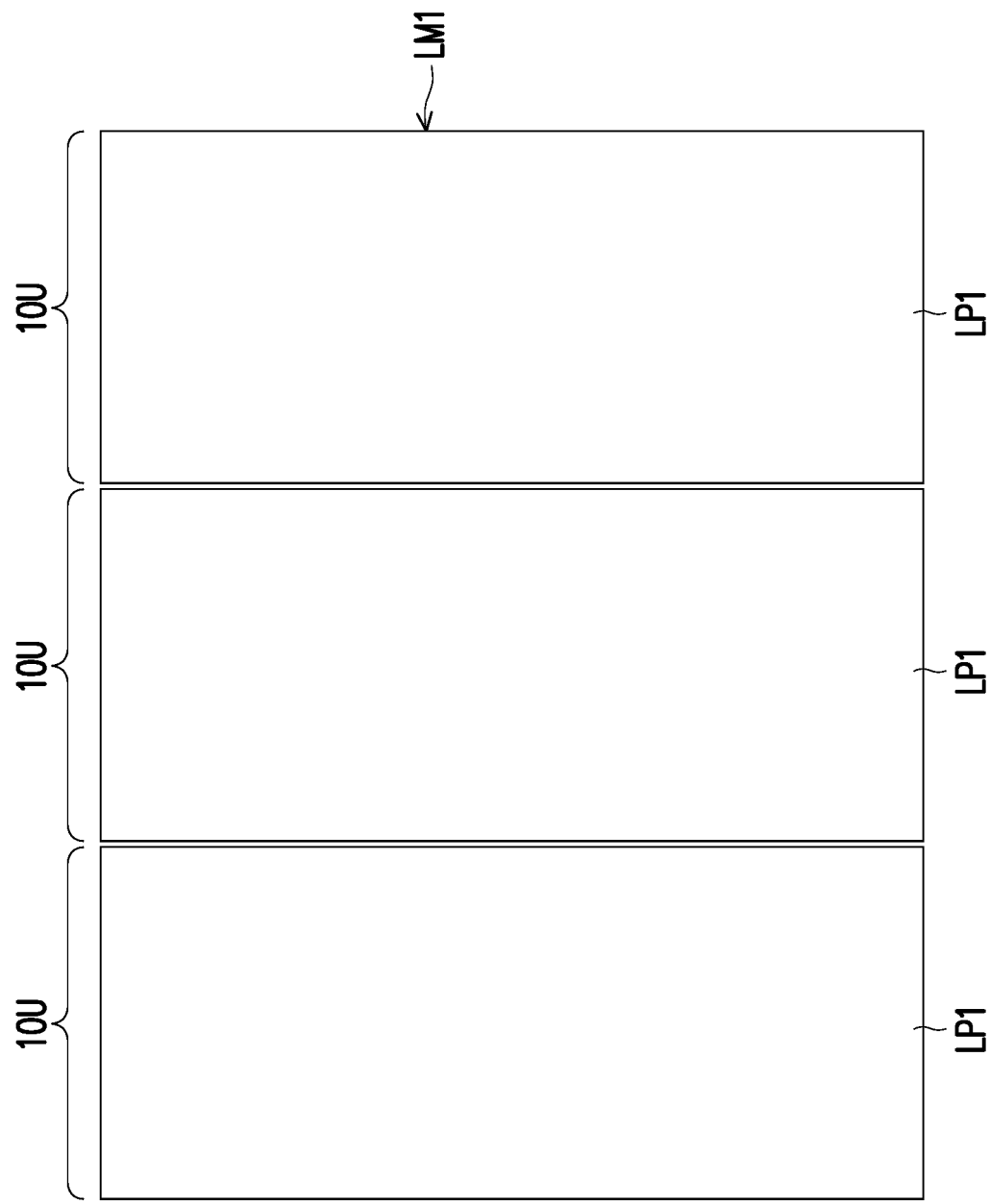

Referring to FIG. 1K and FIG. 2A, the first lower conductive layer LM1 includes a plurality of first lower conductive blocks LP1 separated from each other. Each first lower conductive block LP1 extends in the first direction D1 and the second direction D2. In some embodiments, each first lower conductive block LP1 is disposed across the plurality of blocks B (for example, B1-B8), so that a portion of the plurality of memory arrays 10, a portion of the plurality of conductive pillars HP and a portion of the plurality of slit structures SLT in the plurality of blocks B are directly disposed on the first lower conductive block LP1, as shown in FIG. 2D. In other embodiments, each first lower conductive block LP1 is disposed across a single block B. In still other embodiments, each first lower conductive block LP1 is disposed across other numbers of blocks B, such as 16 blocks.

Referring to FIG. 1K and FIG. 2C, the second lower conductive layer LM2 includes a plurality of second lower conductive blocks LP2 separated from each other. Each second lower conductive block LP2 extends in the first direction D1 and the second direction D2. In some embodiments, each second lower conductive block LP2 is disposed across the plurality of blocks B (for example, B1-B8) to cover the first lower conductive block LP1, so that a portion of the plurality of memory arrays 10, a portion of the plurality of conductive pillars HP and a portion of the plurality of slit structures SLT in the plurality of blocks B are directly disposed on the second lower conductive block LP2, as shown in FIG. 2D. In other embodiments, each second lower conductive block LP2 is disposed across a single block B. In still other embodiments, each second lower conductive block LP2 is disposed across other numbers of blocks B, such as 16 blocks.

Referring to FIG. 1I and FIG. 1J, the plurality of first vias V1 are located between and connected to the plurality of first lower conductive blocks LP1 and the plurality of second lower conductive block LP2. In other words, the plurality of first lower conductive blocks LP1 and the plurality of second lower conductive block LP2 are connected in parallel by the plurality of first vias V1. The plurality of first lower conductive blocks LP1, the plurality of second lower conductive block LP2, and the plurality of first vias V1 form the lower hot plate LP of the heater 100.

Referring to FIG. 1J, a lower dielectric layer BD4 is located between the gate stack structure GSK and the second lower conductive layer LM2. An upper dielectric layer TD0 is located between the gate stack structure GSK and the first upper conductive layer UM1. The source pillars 32a and the drain pillars 32b are located between the lower dielectric layer BD4 and the upper dielectric layer TD0. The plurality of conductive pillars HP further extend through the lower dielectric layer BD4 and the upper dielectric layer TD0. The length of the conductive pillar HP is greater than the length of the source pillar 32a and the length of the drain pillar 32b. Therefore, the conductive pillars HP laterally adjacent to the plurality of source pillars 32a and the plurality of drain pillars 32b may heat the plurality of memory cells 20 formed at the intersections of the plurality of source pillars 32a, the plurality of drain pillars 32b and the gate layers 38 completely.

Referring to FIG. 1I to FIG. 1K, the upper interconnect structure UIT includes upper dielectric layers TD1, TD2, and TD3, and a first upper conductive layer UM1, a second upper conductive layer UM2 and a plurality of second vias V2 therein respectively. The first upper conductive layer UM1 is located above the gate stack structure GSK. The second upper conductive layer UM2 is located above the first upper conductive layer UM1. The plurality of second vias V2 are located between are electrically connected to the first upper conductive layer UM1 and the second upper conductive layer UM2.

Referring to FIG. 1J and FIG. 1K, the first upper conductive layer UM1 includes a plurality of first upper conductive blocks UP1 separated from each other, and the plurality of first upper conductive blocks UP1 are electrically connected to the plurality of conductive pillars HP therebelow. Referring to FIG. 1K and FIG. 2E, each first upper conductive block UP1 extends in the first direction D1 and the second direction D2. In some embodiments, each first upper conductive block UP1 is disposed across the plurality of blocks B (for example, B1-B8) to cover a portion of the plurality of memory arrays 10, a portion of the plurality of conductive pillars HP, and a portion of the plurality of slit structures SLT in the plurality of blocks B shown in FIG. 1K and FIG. 2D. In other embodiments, each first upper conductive block UP1 is disposed across a single block B. In still other embodiments, each first upper conductive block UP2 is disposed across other numbers of blocks B, such as 16 blocks.

Referring to FIG. 1I, in some embodiments, each second lower conductive block LP2 is covered by two first upper conductive blocks UP1 separated from each other. The area of the first upper conductive block UP1 is smaller than that of the corresponding second lower conductive block LP2.

Referring to FIG. 1I and FIG. 2E, the first upper conductive layer UM1 further includes a plurality of local source lines LSL and a plurality of local bit lines LBL extending in the second direction D2. The plurality of local source lines LSL are connected to the plurality of source pillars 32a shown in FIG. 1I or FIG. 2D. The plurality of local bit lines LBL are connected to the plurality of drain pillars 32b shown in FIG. 1I or FIG. 2D. The plurality of local source lines LSL and the plurality of local bit lines LBL are located between the plurality of first upper conductive blocks UP1. As shown in FIG. 1J and FIG. 2E, in some embodiments, each memory array 10, the two rows of conductive pillars HP on both sides thereof, the lower interconnect structure LIT thereabove and the upper interconnect structure UIT therebelow may be also referred to as a module unit 10U. The present invention is not limited thereto. In each module unit 10U, more or less rows of conductive pillars HP may be disposed on both sides of each memory array 10. The two rows of conductive pillars HP on both sides of each module unit 10U are connected to two first upper conductive blocks UP1. The two rows of conductive pillars HP on both sides of each module unit 10U are connected to one second lower conductive block LP2.

In FIG. 1H, in some embodiments, four module units 10U1, 10U2, 10U3, 10U4 are disposed between two staircase structures SC. However, the embodiments of the present invention are not limited thereto. In other embodiments, fewer (for example, 2) module units may be disposed between two staircase structures SC. In other embodiments, more (for example, 4, 8, 16 or 32) module units 10U may be disposed between two staircase structures SC.

Figure 2B:
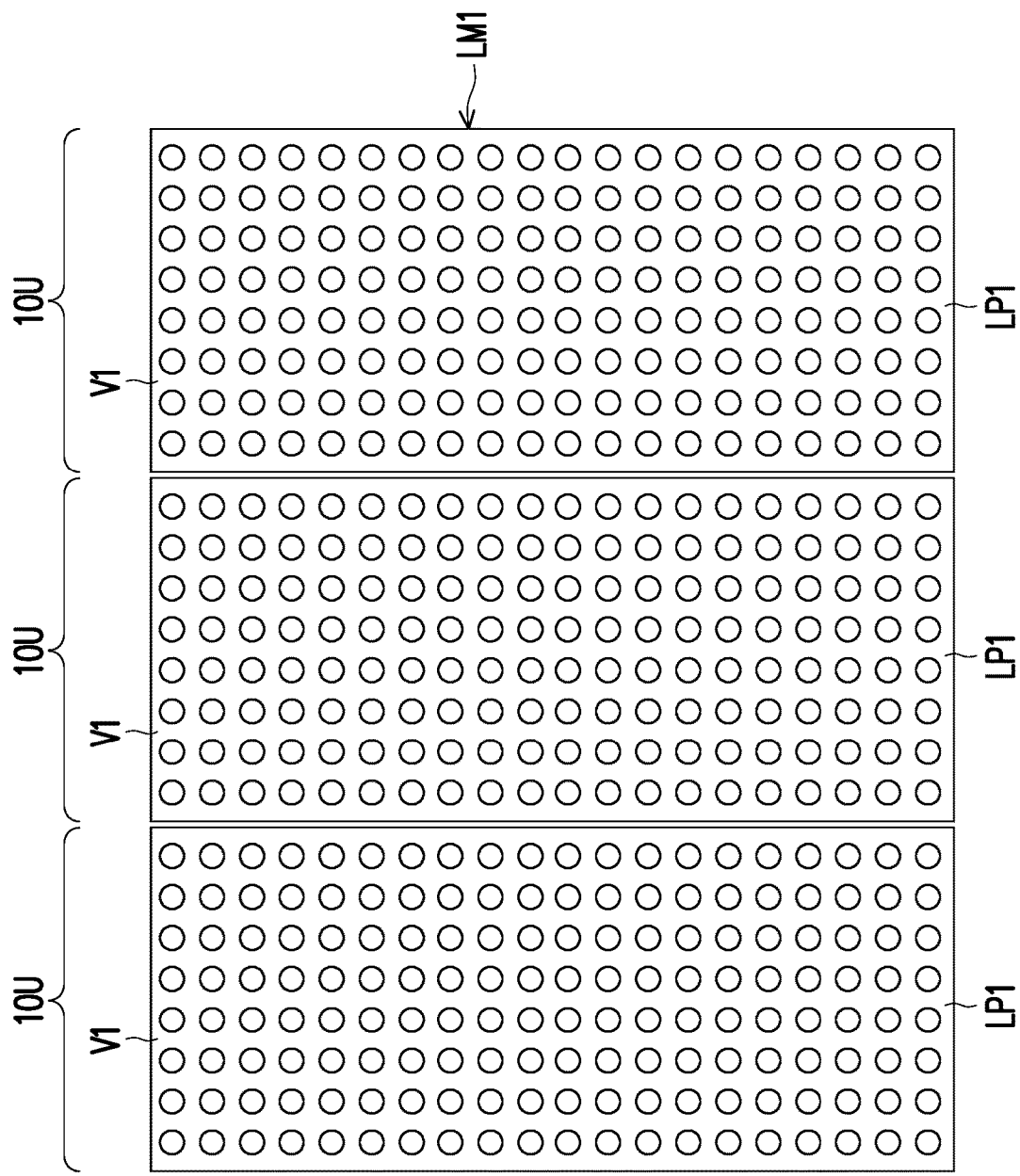
Figure 2D:
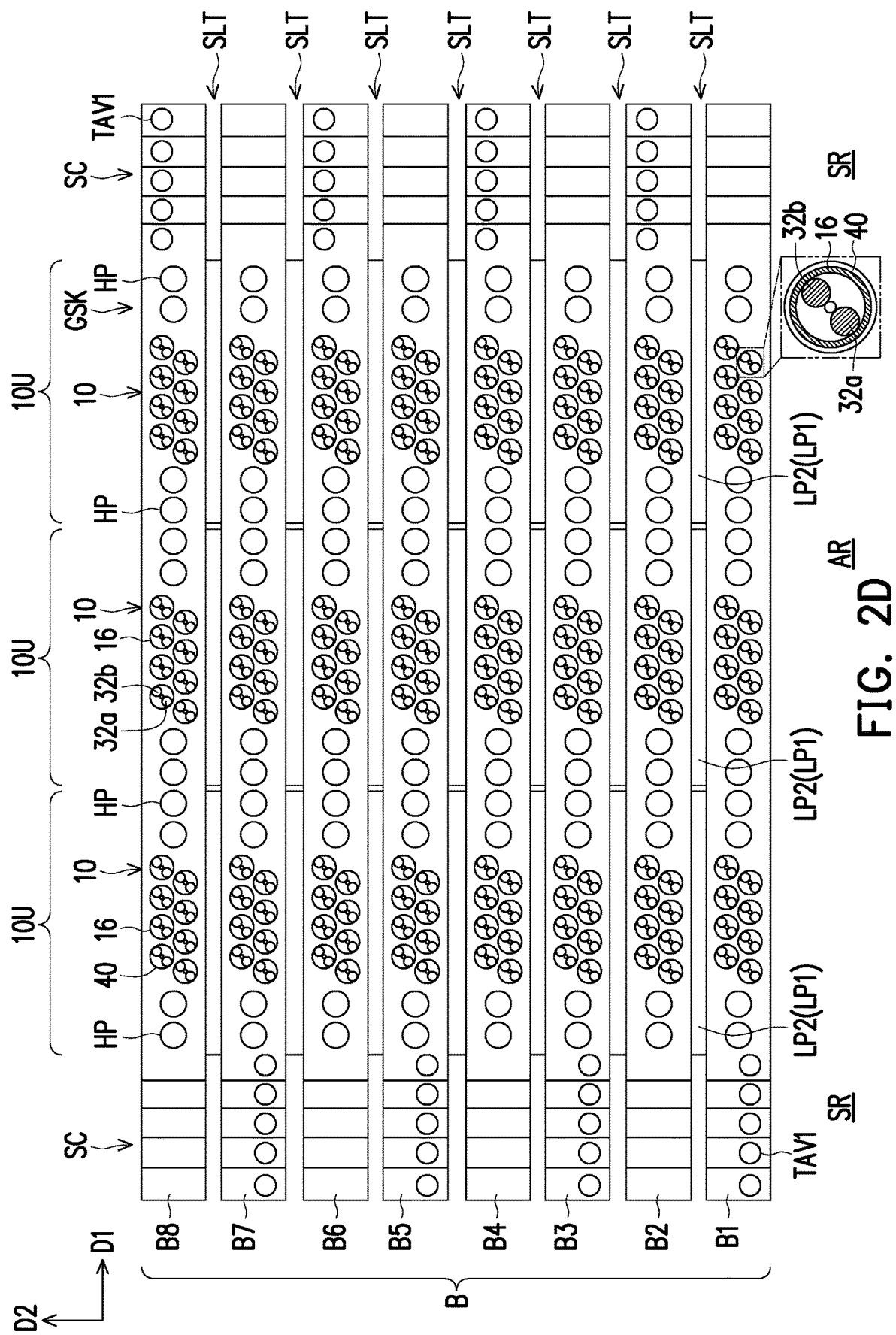
Figure 2E:
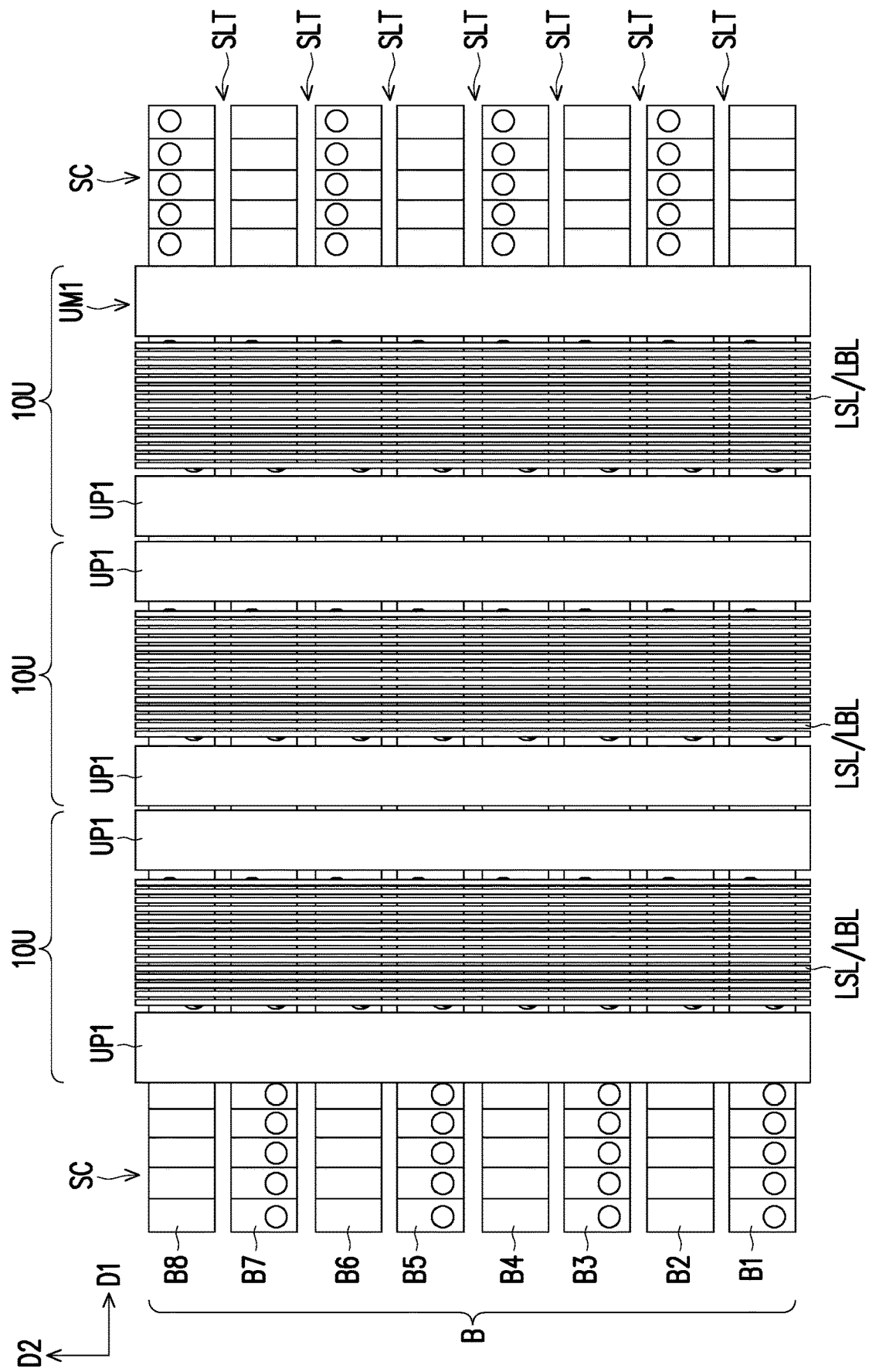
Figure 2F:
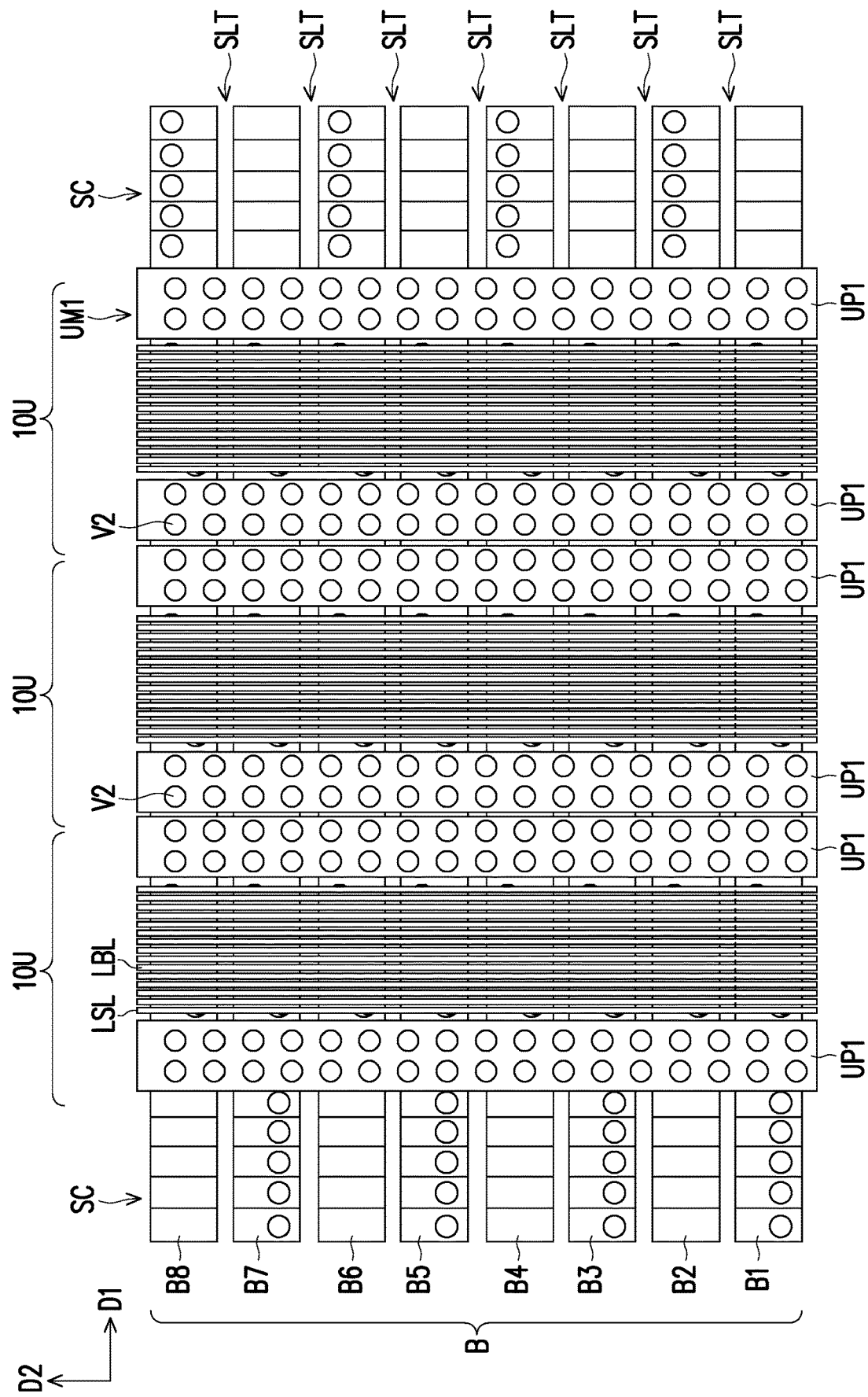
Figure 2G:
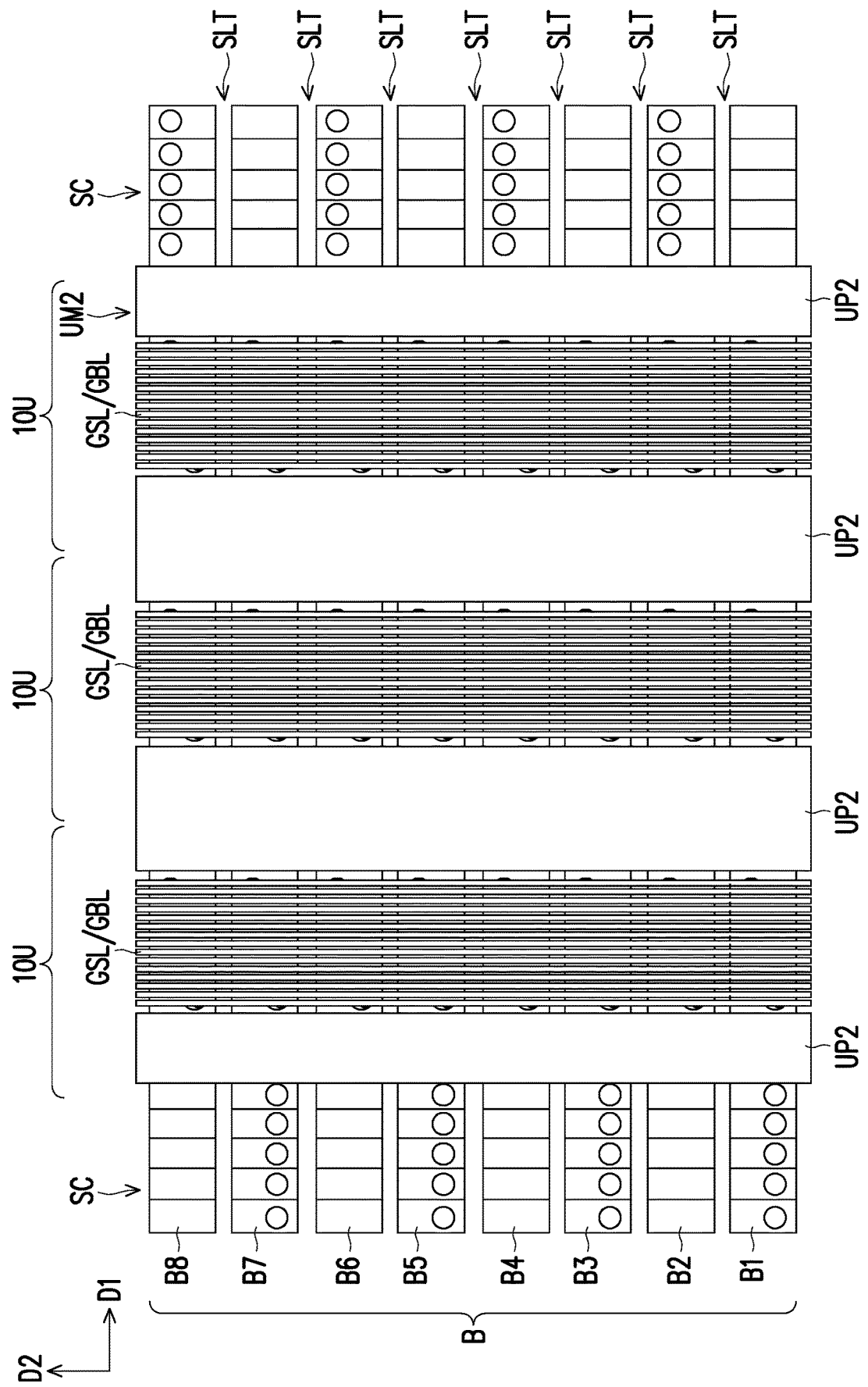

Referring to FIG. 1K and FIG. 2G, the second upper conductive layer UM2 is located above the first upper conductive layer UM1. The second upper conductive layer UM2 includes a plurality of second upper conductive blocks UP2 separated from each other. Each second upper conductive block UP2 extends in the first direction D1 and the second direction D2. In some embodiments, each second upper conductive block UP2 is disposed across a plurality of blocks B (for example, B1 to B8) in the second direction D2, to cover the first upper conductive block UP1. In some embodiments, each second upper conductive block UP2 is disposed across a single block B (for example, B1-B8) to cover the first upper conductive block UP1. In yet other embodiments, each second upper conductive block UP2 is disposed across other numbers of blocks B, for example, 16 blocks, to cover the plurality of first upper conductive blocks UP1. Furthermore, in some embodiments, each second upper conductive block UP2 in the central region covers two adjacent first upper conductive blocks UP1 of two adjacent module units 10U, and each second upper conductive block UP2 in the edge region covers a single first upper conductive block UP1.

Referring to FIG. 1I, FIG. 1J, FIG. 1K and FIG. 2F, a plurality of second vias V2 are located between and connected to the plurality of first upper conductive blocks UP1 and the plurality of second upper conductive blocks UP2. In other words, the plurality of first upper conductive blocks UP1 and the plurality of second upper conductive blocks UP2 are connected in parallel with each other through the plurality of second vias V2. The plurality of first upper conductive blocks UP1, the plurality of second upper conductive blocks UP2 and the plurality of second via V2 form the upper hot plate UP of the heater 100. In other words, each upper hot plate UP is shared by two adjacent module units 10U.

Referring to FIG. 1J and FIG. 2G, the second upper conductive layer UM2 further includes a plurality of global source lines GSL and a plurality of global bit lines GBL extending in the second direction D2. The plurality of global source lines GSL are connected to the local source lines LSL through the second vias V2. The plurality of global bit lines GBL are connected to the local bit lines LBL through the second vias V2. The plurality of global source lines GSL and the plurality of global bit lines GBL are located between the plurality of second upper conductive blocks UP2.

Referring to FIG. 1K, FIG. 2C and FIG. 2F, the area of the first upper conductive block UP1 is smaller than that of the corresponding second lower conductive block LP2.

Referring to FIG. 2B, the plurality of first vias V1 connecting the first lower conductive block LP1 may be arranged in a first array. Referring to FIG. 2F, the plurality of second vias V2 connecting the first upper conductive block UP1 may be arranged in a second array. The number of the first vias V1 in the first array is greater than the number of the second vias V2 in the second array. However, the present invention is not limited thereto. The plurality of first vias V1 may be arranged in a non-array, and the plurality of second vias V2 may also be arranged in a non-array.

Each lower hot plate LP is connected in series with the upper hot plate UP through a plurality of conductive pillars HP. The upper hot plate UP connects a plurality of conductive pillars HP of two adjacent module units 10U1. Thereby, the plurality of lower hot plates LP, the plurality of conductive pillars HP, and the plurality of upper hot plates UP may form the heater 100.

Referring to FIG. 1J, the heater 100 has a snake-like shape, and may surround the plurality of memory arrays 10 in the plurality of module units 10U, to heat these memory arrays 10 nearby. During the repair process, the current may enter from the first end E1 of the heater 100, pass through the heater 100, and then flow out from the second end E2 of the heater 100.

FIG. 2A to FIG. 2G are cross-sectional views of a manufacturing process of a 3D AND flash memory device according to an embodiment of the present disclosure.

Referring to FIG. 1J and FIG. 2A, a substrate 48 is provided. The substrate 48 may further include a device layer (not shown) on a semiconductor substrate. The device layer may include active devices or passive devices. The active devices are, for example, transistors, diodes, and the like. The passive devices are, for example, capacitors, inductors, and the like. The transistor may be an N-type metal-oxide-semiconductor (NMOS) transistor, a P-type metal-oxide-semiconductor (PMOS) transistor, or a complementary metal-oxide-semiconductor (CMOS). For example, the device layer may include page buffers.

Referring to FIG. 1J, a lower interconnect structure LIT is formed on the device layer of the substrate 48. First, a lower dielectric layer BD0 is formed on the device layer, and a plurality of conductive plugs (not shown) are formed in the lower dielectric layer BD0. The lower dielectric layer BD0 is, for example, silicon oxide. The plurality of conductive plugs may extend through the dielectric layer BD0 to electrically connect the device layer. The conductive plug includes a conductive layer and a barrier layer surrounding the conductive layer. The conductive layer is, for example, tungsten. The barrier layer is, for example, titanium, titanium nitride, tantalum, tantalum nitride, or a combination thereof.

Referring to FIG. 1J and FIG. 2A, then, a conductive layer is formed on the lower dielectric layer BD0, and the conductive layer is patterned through lithography and etching processes to form a first lower conductive layer LM1. The first lower conductive layer LM1 includes a plurality of first lower conductive blocks LP1 separated from each other and a plurality of conductive lines LW1. The material of the conductive layer includes metal, such as copper.

Referring to FIG. 1J, a lower dielectric layer BD1 is formed on the first lower conductive layer LM1. The lower dielectric layer BD1 is, for example, silicon oxide. Afterwards, a chemical mechanical polishing process may be performed to planarize the lower dielectric layer BD1.

Referring to FIG. 1J, next, a lower dielectric layer BD2 is formed on the lower dielectric layer BD1 and the first lower conductive layer LM1. Next, referring to FIG. 1J and FIG. 2B, a plurality of first vias V1 connected to the plurality of first lower conductive blocks LP1 are formed in the lower dielectric layer BD2. The plurality of first vias V1 include a conductive material, such as tungsten. The formation of the plurality of first vias V1 includes, for example, forming a plurality of via holes in the lower dielectric layer BD2, and then forming a conductive material on the lower dielectric layer BD2 to fill the plurality of via holes. After that, a chemical mechanical polishing process or an etch-back process is performed to remove excess conductive material on the lower dielectric layer BD2.

Referring to FIG. 1J and FIG. 2C, a conductive layer is formed on the lower dielectric layer BD2 and the plurality of first vias V1, and the conductive layer is patterned through a lithography and etching process to form a second lower conductive layer LM2. The second lower conductive layer LM2 includes a plurality of second lower conductive block LP2 separated from each other and a plurality of conductive lines LW2. The material of the conductive layer includes metal, such as copper.

Referring to FIG. 1J, after that, a lower dielectric layer BD3 is formed on the second lower conductive layer LM2. The lower dielectric layer BD3 may be planarized through a chemical mechanical polishing process. The lower dielectric layer BD3 is, for example, silicon oxide. After that, a lower dielectric layer BD4 is formed on the lower dielectric layer BD3 and the second lower conductive layer LM2. The lower dielectric layer BD4 may be planarized through a chemical mechanical polishing process. The lower dielectric layer BD4 is, for example, silicon oxide. So far, the fabrication of the lower interconnect structure LIT is completed. However, the embodiments of the present invention are not limited thereto. The formation of the lower interconnect structure LIT is not limited thereto. In other embodiments, the second lower conductive layer LM2 and the plurality of first vias V1 may be formed by a dual damascene process. That is, the dielectric layer BD2' may be formed first. After that, an opening having a trench and a via hole is formed in the dielectric layer BD2'. Afterwards, the barrier material and the conductive material are filled in the opening to simultaneously form the second lower conductive layer LM2 and the plurality of first via V1. The conductive material is, for example, tungsten. The barrier material is, for example, titanium, titanium nitride, tantalum, tantalum nitride, or a combination thereof. In addition, the lower interconnect structure LIT may include more lower conductive layers and lower dielectric layers.

Referring to FIG. 1J and FIG. 2D, next, a plurality of memory arrays 10 and a plurality of slit structures SLT are formed on the lower dielectric layer BD4. The memory array 10 includes a gate stack structure GSK. The gate stack structure GSK in the staircase region SR has a plurality of staircase structures SC, and the staircase structures SC are covered by the dielectric layer MD (as shown in FIG. 1J). The memory array 10 further includes a plurality of charge storage structures 40, a plurality of channel pillars 16, a plurality of source pillars 32a and a plurality of drain pillars 32b. The plurality of channel pillars 16, the plurality of source pillars 32a and the plurality of drain pillars 32b extend through the gate stack structure GSK of the memory array region AR between the plurality of staircase structures SC. The plurality of charge storage structures 40 are located between the plurality of gate layers 38 and the plurality of channel pillars 16. The plurality of slit structures SLT extend in the first direction D1, and divide the gate stack structure GSK into a plurality of blocks B. The memory array 10 and the plurality of slit structures SLT may be formed by any known method, which will not be described in detail here.

Referring to FIG. 1J and FIG. 2E, an upper dielectric layer TD0 of the upper interconnect structure UIT is formed on the substrate 48. The upper dielectric layer TD0 covers the memory array 10 in the memory array region AR and the dielectric layer MD in the staircase region SR.

Figure 3:
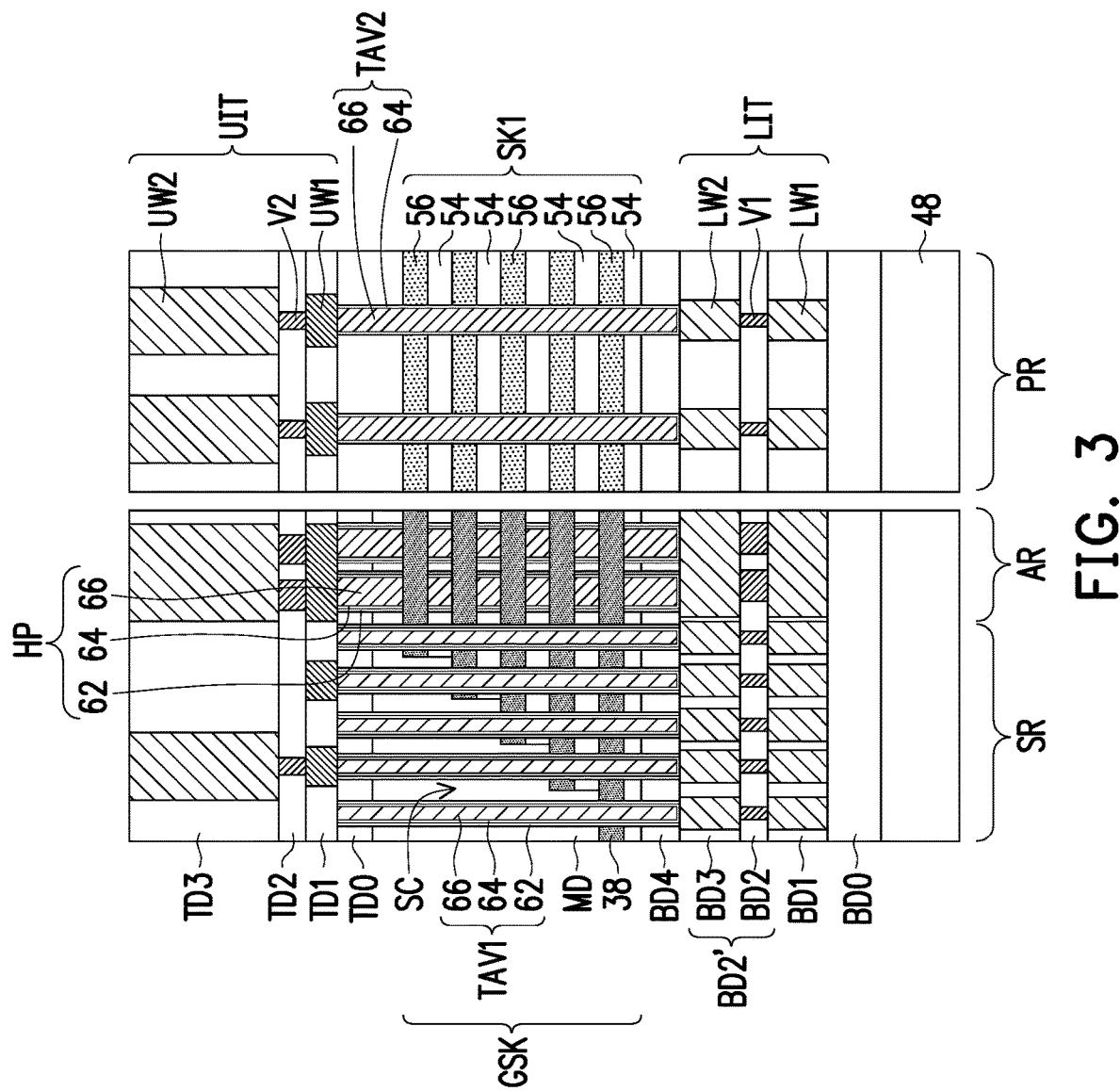
FIG. 3 illustrates various parts of a 3D AND flash memory device having a heater according to embodiments of the present disclosure.

Referring to FIG. 3, the upper dielectric layer TD0 also covers an intermediate stack structure SK1 in the peripheral region PR. The intermediate stack structure SK1 includes a plurality of interlayers 56 and a plurality of insulating layers 54 stacked alternately. The plurality of interlayers 56 in the memory array region AR are then be replaced with a plurality of gate layers 38 through a replacement process. The plurality of interlayers 56 in the peripheral region PR are not replaced in the replacement process, and thus remain. The upper dielectric layer TD0 is, for example, silicon oxide.

Referring to FIG. 1J, FIG. 2D and FIG. 3, then, a plurality of vias VAA, a plurality of contacts (not shown), a plurality of conductive pillars HP and a plurality of array vias TAV1, TAV2 (shown in FIG. 3, similar to TAV2 in FIG. 1H) are formed.

Referring to FIG. 1J, the plurality of vias VAA extend through the upper dielectric layer TD0 in the memory array region AR, and land on and are electrically connected to the plurality of source pillars 32a and the plurality of drain pillars 32b.

The plurality of contacts (not shown) extend through the upper dielectric layer TD0 and the dielectric layer MD in the staircase region SR, and land on and are electrically connected to the ends of the plurality of gate layers 38 of the staircase structure SC.

Referring to FIG. 1J, FIG. 2D and FIG. 3, the array via TAV1 extends through the upper dielectric layer TD0 and the dielectric layer MD in the staircase region SR, the plurality of gate layers 38 and the plurality of insulating layers 54 of the staircase structure SC and the lower dielectric layer BD4. Each array via TAV1 may land on and be electrically connected to one of the plurality of conductive lines LW2 of the second lower conductive layer LM2.

Referring to FIG. 3, the plurality of array vias TAV2 extend through the dielectric layer TD0 in the peripheral region PR, the plurality of interlayers 56 and the plurality of insulating layers 54 of the intermediate stack structure SK1, and the lower dielectric layer BD4. Each array via TAV2 may land on and be electrically connected to another of the conductive lines LW2 of the second lower conductive layer LM2.

Referring to FIG. 1J, FIG. 2D and FIG. 3, the plurality of conductive pillars HP extend through the upper dielectric layer TD0 in the memory array region AR, the plurality of gate layers 38 and the plurality of insulating layers 54 of the gate stack structure GSK and the lower dielectric layer BD4. The plurality of conductive pillars HP land on and are electrically connected to the plurality of second lower conductive blocks LP2 of the second lower conductive layer LM2.

In some embodiments, the plurality of vias VAA, the plurality of contacts (not shown), and the plurality of array vias TAV2 may include a conductive layer. In other embodiments, the plurality of vias VAA, the plurality of contacts (not shown), and the plurality of array vias TAV2 may include a conductive layer and a barrier layer surrounding the conductive layer. The conductive layer is, for example, tungsten. The barrier layer is, for example, titanium, titanium nitride, tantalum, tantalum nitride, or a combination thereof. Since the plurality of vias VAA, the plurality of contacts (not shown), and the plurality of array vias TAV2 are surrounded by insulating materials (i.e., the upper dielectric layer TD0, the dielectric layer MD, the plurality of interlayers 56 and the plurality of insulating layers 54 of the intermediate stack SK1 and the lower dielectric layer BD4), there is no need to additionally form a liner on the periphery of the conductive layer (or the conductive layer and the barrier layer). The plurality of vias VAA, the plurality of contacts (not shown), and the plurality of array vias TAV2 may be formed simultaneously or individually, and the formation method thereof may be similar to or different from the formation method of the plurality of vias V1.

Referring to FIG. 3, since the plurality of conductive pillars HP and the plurality of array vias TAV1 extend through the plurality of gate layers 38, the plurality of conductive pillars HP and the plurality of array vias TAV1 include not only the conductive layer (or the conductive layer and the barrier layer) but also a liner electrically insulated from the plurality of gate layers 38. The conductive layer is, for example, tungsten. The barrier layer is, for example, titanium, titanium nitride, tantalum, tantalum nitride, or a combination thereof. The liner is, for example, silicon oxide, silicon nitride, or a combination thereof.

The formation of the plurality of conductive pillars HP and the plurality of array vias TAV1 includes, for example, forming a plurality of openings extending through the upper dielectric layer TD0, the plurality of gate layers 38, the plurality of insulating layers 54 and the lower dielectric layer BD4 in the memory array region AR and the staircase region SR. Next, a lining material, a barrier material and a conductive material are formed in the upper dielectric layer TD0 and the plurality of openings. Afterwards, an etch-back or chemical mechanical polishing process is performed to remove excess lining material, barrier material and conductive material.

Referring to FIG. 1J and FIG. 2E, next, other portions of the upper interconnect structure UIT are formed above the substrate 48. A conductive layer is formed on the upper dielectric layer TD0, and the conductive layer is patterned through lithography and etching processes to form a first upper conductive layer UM1. The first upper conductive layer UM1 includes a plurality of first upper conductive blocks UP1 separated from each other, a plurality of local source lines LSL and a plurality of local bit lines LBL, and a plurality of conductive lines UW1. The material of the conductive layer includes metal, such as copper.

The plurality of first upper conductive blocks UP1 are located in the memory array region AR, and the plurality of first upper conductive blocks UP1 are connected to the plurality of conductive pillars HP. The plurality of local source lines LSL and the plurality of local bit lines LBL are respectively connected to the plurality of source pillars 32a and the plurality of drain pillars 32b through the vias VAA. The plurality of conductive lines UW1 are respectively connected to the plurality of array vias TAV1 in the staircase region SR and the plurality of array vias TAV2 in the peripheral region PR (as shown in FIG. 3).

Referring to FIG. 1J, upper dielectric layers TD1 and TD2 are formed around and on the first upper conductive layer UM1. The upper dielectric layers TD1 and TD2 are, for example, silicon oxide. After that, a chemical mechanical polishing process may be performed to planarize the upper dielectric layers Td1 and TD2 respectively.

Referring to FIG. 1J and FIG. 2F, next, a plurality of second vias V2 are formed in the upper dielectric layer TD2. Portions of the plurality of second vias V2 are connected to the plurality of first upper conductive blocks UP1, as shown in FIG. 1J. Other portions of the plurality of second vias V2 are connected to the plurality of local source lines LSL and the plurality of local bit lines LBL, as shown in FIG. 2F. Still other portions of the plurality of second vias V2 are connected to the plurality of conductive lines UW1, as shown in FIG. 2F. The plurality of second vias V2 includes a conductive material, such as tungsten. The formation of the plurality of second vias V2 includes, for example, forming via holes in the upper dielectric layer TD2, and then forming a conductive material on the upper dielectric layer TD2 to fill the via holes. After that, a chemical mechanical polishing process or an etch-back process is performed to remove excess conductive material on the upper dielectric layer TD2.

Referring to FIGS. 1J and 2C, a conductive layer is formed on the upper dielectric layer TD2 and the plurality of second vias V2, and the conductive layer is patterned through lithography and etching processes to form a second upper conductive layer UM2. The second upper conductive layer UM2 includes a plurality of second upper conductive blocks UP2 separated from each other, a plurality of global source lines GSL, a plurality of global bit lines GBL and a plurality of conductive lines UW2. The material of the conductive layer includes metal, such as copper. The plurality of second upper conductive blocks UP2 are connected to the plurality of first upper conductive blocks UP1 through the plurality of second vias V2. The plurality of global source lines GSL and the plurality of global bit lines GBL are respectively connected to the plurality of local source lines LSL and the plurality of local bit lines LBL through the plurality of second vias V2. The plurality of conductive lines UW2 are connected to the plurality of array vias TAV1 and TAV2 through the plurality of second vias V2 and the plurality of conductive lines UW1, respectively.

After that, an upper dielectric layer TD3 is formed on the second upper conductive layer UM2 and the upper dielectric layer TD2, as shown in FIG. 1J. The upper dielectric layer TD3 may be planarized by a chemical mechanical polishing process. The upper dielectric layer TD3 is, for example, silicon oxide. So far, the fabrication of the upper interconnect structure UIT is completed. However, the embodiments of the present invention are not limited thereto. The upper interconnect structure UIT may include more upper conductive layers and upper dielectric layers. In other embodiments, the second upper conductive layer UM2 and the plurality of second vias V2 may be formed by a dual damascene process. In addition, the formation method of the upper interconnect structure UIT is not limited thereto.

Figure 4:
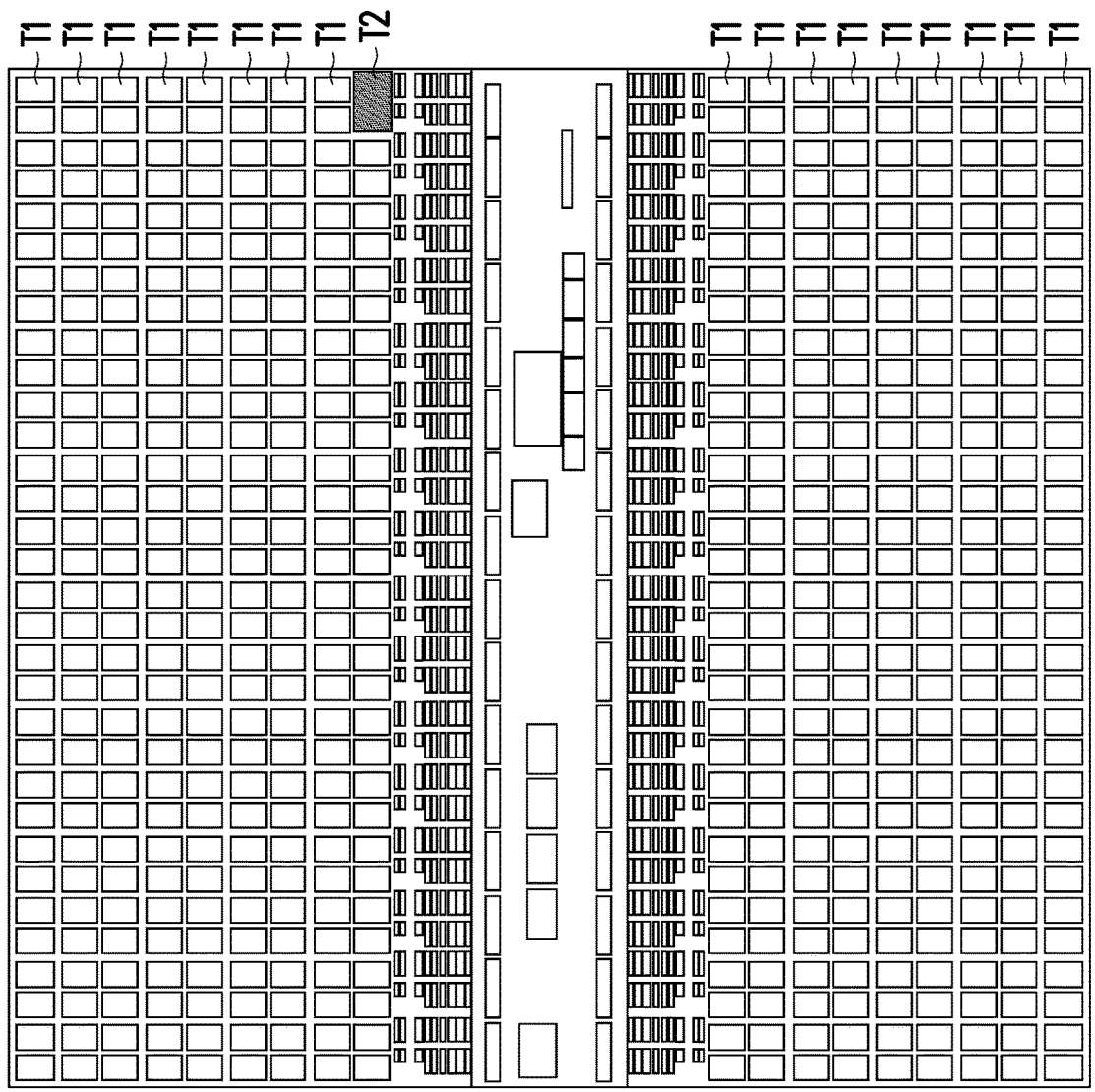
FIG. 4 is a top view of a 3D AND flash memory chip according to an embodiment of the present invention.

FIG. 4 is a top view of a 3D AND flash memory chip according to an embodiment of the present invention.

Referring to FIG. 4, the flash memory chip 99 includes a plurality of tiles T. The tiles T may include first tiles T1 and second tiles T2.

Each first tile T1 has a plurality of first memory cells located in the first gate stack structure. The second tile T2 has a plurality of first memory cells and a heater located in the second gate stack structure. The heater of the second tile T2 is disposed in the second gate stack structure, so as to heat a plurality of memory arrays composed of the plurality of memory cells nearby. The second block T2 may include a single heater or a plurality of heaters according to the design. The single heater may heat all memory arrays. The plurality of heaters may locally heat specific regions of the memory arrays as needed.

In some embodiments, a heater is disposed in the second gate stack structure of the second tile T2, and no heater is disposed in the first gate stack structure of the first tile T1. In other embodiments, heaters are disposed in both the second gate stack structure of the second tile T2 and the first gate stack structure of the first tile T1. However, the density of the conductive pillars of the heaters in the second gate stack structure of the second tile T2 is larger than the density of the conductive pillars of the heaters in the first gate stack structure of the first tile T1.

Because the heater is disposed in the second tile T2, or the density of the conductive pillars of the heater in the second tile T2 is higher than the density of the conductive pillars of the heater in the first tile T1, the first tile T1 and the second tile T2 have different density of memory cells. That is, the density of the memory cells of the second tile T2 is lower than the density of the memory cells of the first tile T1. For example, the density of the memory cells of the first tile T1 is 10 to 20 times that of the memory cells of the second tile T2.

The number of first tiles T1 is different from the number of second tiles T2 for each chip. The number of first tiles T1 is larger than the number of second tiles T2. In FIG. 4, each chip may include a plurality of first tiles T1 and a single second tile T2. However, the present invention is not limited thereto. In other embodiments, each chip may include a plurality of first tiles T1 and two or more second tiles T2.

The location of the first tile T1 is different from the location of the second tile T2. The location of the second tile T2 is close to the switch pad to provide better heating efficiency. The second tile T2 is disposed at the edge of the chip, but the present invention is not limited thereto.

The second tile T2 may improve the endurance and retention of the memory cell through the arrangement of the heater, so that it may be applied to the user's key status register. Accordingly, it is not required to evenly use each storage tile or block of the flash memory through wear-leveling technique, which avoids some "specific" storage tile or block being bad tile or block due to overuse. Therefore, by means of the flash memory with the heater, the lifetime of the product may be extended optimally to meet the system requirements.

To sum up, in the embodiment of the present invention, the array vias aside the memory cell are used as conductive pillars. The conductive pillar may locally and slightly heat the flash memory cell nearby. The plurality of conductive layers above and below the gate stack structure may be respectively connected in parallel, so as to form a plurality of upper hot plates and a plurality of lower hot plates. These upper hot plates and lower hot plates are connected in series by the conductive pillars to increase the resistance value. In some embodiments, the heater has a resistance value of about 50 ohms to 1000 ohms. In other embodiments, the heater has a resistance value of about 100 ohms to 200 ohms.

When Vdd (~3V) is applied to the heater, Joule heating may be generated to locally provide high temperature (>400 C) for 3D flash memory in a small region (e.g., having a size of about 7 um*100 um) to simultaneously heat thousands of memory cells. The experimental results demonstrate that the physical property of the self-heating flash memory is simple and stable, and thus the self-heating flash memory provides ultra-high endurance (~1G P/E cycles) and good retention.

Embodiments of the present invention may design a special array for the status register in the 3D AND chip and provide a "perfect" NVM (e.g., having almost unlimited durability and retention) to record the most key information for the user. In addition, this special array does not use wear-leveling technique for use. Compared to MRAM, this flash memory with TAV heater may form an array with higher density (>Mb) and have very high endurance and retention, so that it may be competitive with MRAM.

The three dimensional flash memory device of the embodiment of the disclosure is not limited to a three dimensional AND flash memory device, but may be applied to a three dimensional NAND flash or NOR flash memory device.

What is claimed is:
1. A three dimensional flash memory device, comprising:
a substrate;
a gate stack structure, located above the substrate;
a plurality of slit structures, extending through the gate stack structure and dividing the gate stack structure into a plurality of blocks;
a plurality of memory arrays, disposed in the gate stack structure of the plurality of blocks;
a plurality of conductive pillars extending through the gate stack structure in the plurality of blocks, wherein the plurality of conductive pillars are disposed between the plurality of memory arrays and between the plurality of slit structures and the plurality of conductive pillars are electrically isolated from the gate stack structure; and
a plurality of source pillars and a plurality of drain pillars, wherein the plurality of source pillars and the plurality of drain pillars extend through the gate stack structure and are laterally adjacent to the plurality of conductive pillars.

2. The three dimensional flash memory device of claim 1, further comprising:
a lower interconnect structure, located below the gate stack structure; and
an upper interconnect structure, located above the gate stack structure,
wherein the plurality of conductive pillars are connected to a portion of the lower interconnect structure and a portion of the upper interconnect structure.

3. The three-dimensional flash memory device of claim 2, wherein the lower interconnect structure comprises:
a first lower conductive layer, located between the substrate and the gate stack structure, wherein the first lower conductive layer comprises a plurality of first lower conductive blocks separated from each other;
a second lower conductive layer, located between the first lower conductive layer and the gate stack structure, wherein the second lower conductive layer comprises a plurality of second lower conductive blocks separated from each other, the plurality of second lower conductive blocks are located on the plurality of first lower conductive blocks, and the plurality of conductive pillars land on the plurality of the second lower conductive blocks; and
a plurality of first vias, located between and connected to the plurality of first lower conductive blocks and the plurality of second lower conductive blocks.

4. The three-dimensional flash memory element of claim 3, wherein the plurality of slit structures extend in a first direction and are laterally adjacent to the plurality of conductive pillars.

5. The three-dimensional flash memory device of claim 4, wherein each first lower conductive block extends in a second direction and across the plurality of blocks, such that a portion of the plurality of memory arrays, a portion of the plurality of conductive pillars and a portion of the plurality of slit structures in the plurality of blocks are arranged above each first lower conductive block, and the second direction is different from the first direction.

6. The three-dimensional flash memory device of claim 5, wherein the upper interconnect structure comprises:
a first upper conductive layer, located above the gate stack structure, wherein the first upper conductive layer comprises a plurality of first upper conductive blocks separated from each other, and the plurality of first upper conductive blocks are electrically connected to the plurality of conductive pillars;
a second upper conductive layer, located above the first upper conductive layer, wherein the second upper conductive layer comprises a plurality of second upper conductive blocks separated from each other and disposed above the plurality of first upper conductive blocks; and a plurality of second vias, located between and connected to the plurality of first upper conductive blocks and the plurality of second upper conductive blocks, wherein the plurality of conductive pillars, the plurality of first lower conductive blocks, the plurality of second lower conductive blocks, the plurality of first vias, the plurality of first upper conductive blocks, the plurality of second upper conductive blocks and the plurality of second vias are electrically coupled to each other.

7. The three-dimensional flash memory device of claim 6, wherein each first upper conductive block extends in the second direction and across the plurality of blocks, to cover the portion of the plurality of conductive pillars and the portion of the plurality of slit structures in the plurality of blocks.

8. The three-dimensional flash memory device of claim 7, wherein each second upper conductive block extends in the second direction, and each second upper conductive block covers the plurality of first upper conductive blocks separated from each other and is electrically connected to the plurality of first upper conductive blocks through a portion of the plurality of second vias.

9. The three dimensional flash memory device of claim 3, further comprising:
a lower dielectric layer, located between the gate stack structure and the second lower conductive layer; and
an upper dielectric layer, located between the gate stack structure and the first upper conductive layer,
wherein the plurality of source pillars and the plurality of drain pillars are located between the lower dielectric layer and the upper dielectric layer, and the plurality of conductive pillars further extend through the lower dielectric layer and the upper dielectric layer.

10. The three-dimensional flash memory device of claim 7, wherein the first upper conductive layer further comprises:
a plurality of local bit lines and a plurality of local source lines, extending in the second direction, connecting to the plurality of memory arrays, and located between the plurality of first upper conductive blocks.

11. The three-dimensional flash memory device of claim 7, wherein an area of the first upper conductive block is smaller than an area of the corresponding second lower conductive block.

12. The three-dimensional flash memory device of claim 7, wherein the plurality of first vias respectively connecting the first lower conductive blocks are arranged in a first array, and the plurality of second vias respectively connecting the first upper conductive blocks are arranged in a second array.

13. The three-dimensional flash memory device of claim 2, further comprising a plurality of array vias, wherein the plurality of array vias are located in a peripheral region, and are electrically connected to the lower interconnect structure and the upper interconnect structure.

14. The three dimensional flash memory device of claim 2, further comprising a plurality of array vias, wherein the plurality of array vias are located in a staircase region of the substrate, extend through a staircase structure of the gate stack structure, and are electrically connected to the lower interconnect structure and the upper interconnect structure.

15. A method of manufacturing a three dimensional flash memory device, comprising:
providing a substrate;
forming a gate stack structure;
forming a plurality of memory arrays in the gate stack structure;
forming a plurality of slit structures, wherein the plurality of slit structures extend through the gate stack structure and divide the gate stack structure into a plurality of blocks;
forming a plurality of conductive pillars in the plurality of blocks, wherein the plurality of conductive pillars are disposed between the plurality of memory arrays and extend through the gate stack structure, and the plurality of conductive pillars are electrically isolated from the gate stack structure; and
forming a plurality of source pillars and a plurality of drain pillars, wherein the plurality of source pillars and the plurality of drain pillars extend through the gate stack structure, and the plurality of source pillars and the plurality of drain pillars are laterally adjacent to the plurality of conductive pillars and located between the plurality of conductive pillars.

16. The method of claim 15, further comprising forming a plurality of array vias in a peripheral region of the substrate or a staircase region of the substrate.

17. The method of claim 15, further comprising:
forming a lower interconnect structure below the gate stack structure; and
forming an upper interconnect structure above the gate stack structure,
wherein the plurality of conductive pillars are connected to a portion of the lower interconnect structure and a portion of the upper interconnect structure.

18. A three dimensional flash memory device, comprising:
a substrate;
a gate stack structure, located above the substrate;
a plurality of slit structures, extending through the gate stack structure and dividing the gate stack structure into a plurality of blocks;
a plurality of memory arrays, disposed in the gate stack structure of the plurality of blocks;
a lower interconnect structure, located below the gate stack structure;
an upper interconnect structure, located above the gate stack structure; and
a plurality of conductive pillars extending through the gate stack structure in the plurality of blocks, wherein the plurality of conductive pillars are disposed between the plurality of memory arrays and between the plurality of slit structures, and the plurality of conductive pillars in the same block are electrically connected to each other through the lower interconnect structure and the upper interconnect structure.

* * * * *